(12) United States Patent
Yousif

(10) Patent No.: US 9,854,703 B1
(45) Date of Patent: *Dec. 26, 2017

(54) MOUNT RACK FRAME

(71) Applicant: Gorgius L. Yousif, Chicago, IL (US)

(72) Inventor: Gorgius L. Yousif, Chicago, IL (US)

(*) Notice: Subject to any disclaimer, the term of this patent is extended or adjusted under 35 U.S.C. 154(b) by 0 days.

This patent is subject to a terminal disclaimer.

(21) Appl. No.: 15/218,032

(22) Filed: Jul. 24, 2016

Related U.S. Application Data

(63) Continuation of application No. 15/200,270, filed on Jul. 1, 2016, now abandoned, which is a continuation-in-part of application No. 14/745,644, filed on Jun. 22, 2015, which is a continuation of application No. 12/387,029, filed on Apr. 27, 2009, now abandoned, which is a continuation-in-part of application No. 11/364,495, filed on Feb. 28, 2006, now abandoned.

(51) Int. Cl.
*H05K 7/18* (2006.01)
*A47B 47/00* (2006.01)
*A47B 57/36* (2006.01)

(52) U.S. Cl.
CPC .............. *H05K 7/18* (2013.01); *A47B 47/00* (2013.01); *A47B 57/36* (2013.01)

(58) Field of Classification Search
CPC ........ H02B 1/012; H02B 1/013; H02B 1/308; H05K 7/183; H05K 7/186
USPC ..... 211/175, 194, 26, 126.15, 189–192, 117; 211/118, 200, 204, 206; 312/223.1, 312/265.1–265.4, 334.4, 334.5, 111; 361/724–727, 829; 248/460; 220/4.02, 220/4.03, 8; 206/503
See application file for complete search history.

(56) References Cited

U.S. PATENT DOCUMENTS

| | | | | |
|---|---|---|---|---|
| 3,265,419 A | * | 8/1966 | Durnbaugh | F16B 12/08 312/265.1 |
| 3,722,971 A | * | 3/1973 | Zeischegg | A47B 47/042 312/107 |
| 4,497,411 A | * | 2/1985 | DeBortoli | H05K 7/186 211/189 |
| 4,643,319 A | * | 2/1987 | Debus | H02B 1/01 211/182 |

(Continued)

*Primary Examiner* — Joshua Rodden
(74) *Attorney, Agent, or Firm* — Adrienne B. Naumann

(57) ABSTRACT

Mount rack frames for storing attaching vertically aligned devices are described herein. The preferred embodiment of a second mount rack frame comprises at least two laterally aligned modular rigid support structures along a rack base with mechanical fasteners that reversibly insert to adjust a dimension of a rigid multi-component support structure. Rigid modular support structures also align with and mechanically attach vertically to each other to increase storage space. Another embodiment of the second modular mount rack frame comprises a single rigid modular support structure that also can vertically align and attach another multi-component support structures without lateral alignment of these structures along a rack base. A third mount rack frame comprises two rigid vertical components, two rigid horizontal components and two rack base legs. None of the disclosed frames or other embodiments thereof require attachments to structures external to the frame to be free standing with or without attached stored devices, except for lowermost contact with a horizontal surface.

19 Claims, 22 Drawing Sheets

(56) References Cited

U.S. PATENT DOCUMENTS

| | | | | |
|---|---|---|---|---|
| 4,664,265 A * | 5/1987 | George, Jr. | ............... | B25H 3/04 206/707 |
| 4,715,502 A * | 12/1987 | Salmon | .................... | H04Q 1/09 211/175 |
| 5,440,844 A * | 8/1995 | Chihara | ................. | E04B 1/2403 211/191 |
| 5,542,549 A * | 8/1996 | Siemon | .................... | H04Q 1/06 211/189 |
| 5,749,476 A * | 5/1998 | Besserer | ................ | H02B 1/301 211/182 |
| 5,979,672 A * | 11/1999 | Gemra | .................... | H02B 1/54 211/189 |
| 6,123,400 A * | 9/2000 | Nicolai | ................. | H02B 1/301 211/189 |
| 6,174,034 B1 * | 1/2001 | Benner | ................. | H02B 1/301 211/26 |
| 6,185,098 B1 * | 2/2001 | Benavides | ........... | H05K 7/1488 174/387 |
| 6,223,908 B1 * | 5/2001 | Kurtsman | ................ | H04Q 1/08 211/175 |
| 6,481,582 B1 * | 11/2002 | Rinderer | ................ | H05K 7/183 211/26 |
| 6,516,955 B1 * | 2/2003 | Dudhwala | ........... | A47B 47/0008 211/182 |
| 6,520,345 B1 * | 2/2003 | Marovic | ................... | H02B 1/34 211/183 |
| 6,591,997 B2 * | 7/2003 | Hung | .................... | H05K 7/183 211/183 |
| 6,902,068 B1 * | 6/2005 | Fontana | ................... | H02B 1/01 211/189 |
| 6,968,962 B2 * | 11/2005 | Toma | .................... | F16B 12/50 211/182 |
| 7,591,056 B2 | 9/2009 | Mimlitch, III | | |
| 7,614,509 B2 * | 11/2009 | Nguyen | ................ | H04Q 1/025 211/26 |
| 2003/0196980 A1 * | 10/2003 | Ahn | ........................ | A47F 5/137 211/189 |
| 2004/0016708 A1 * | 1/2004 | Rafferty | ............... | H05K 7/1492 211/26 |

* cited by examiner

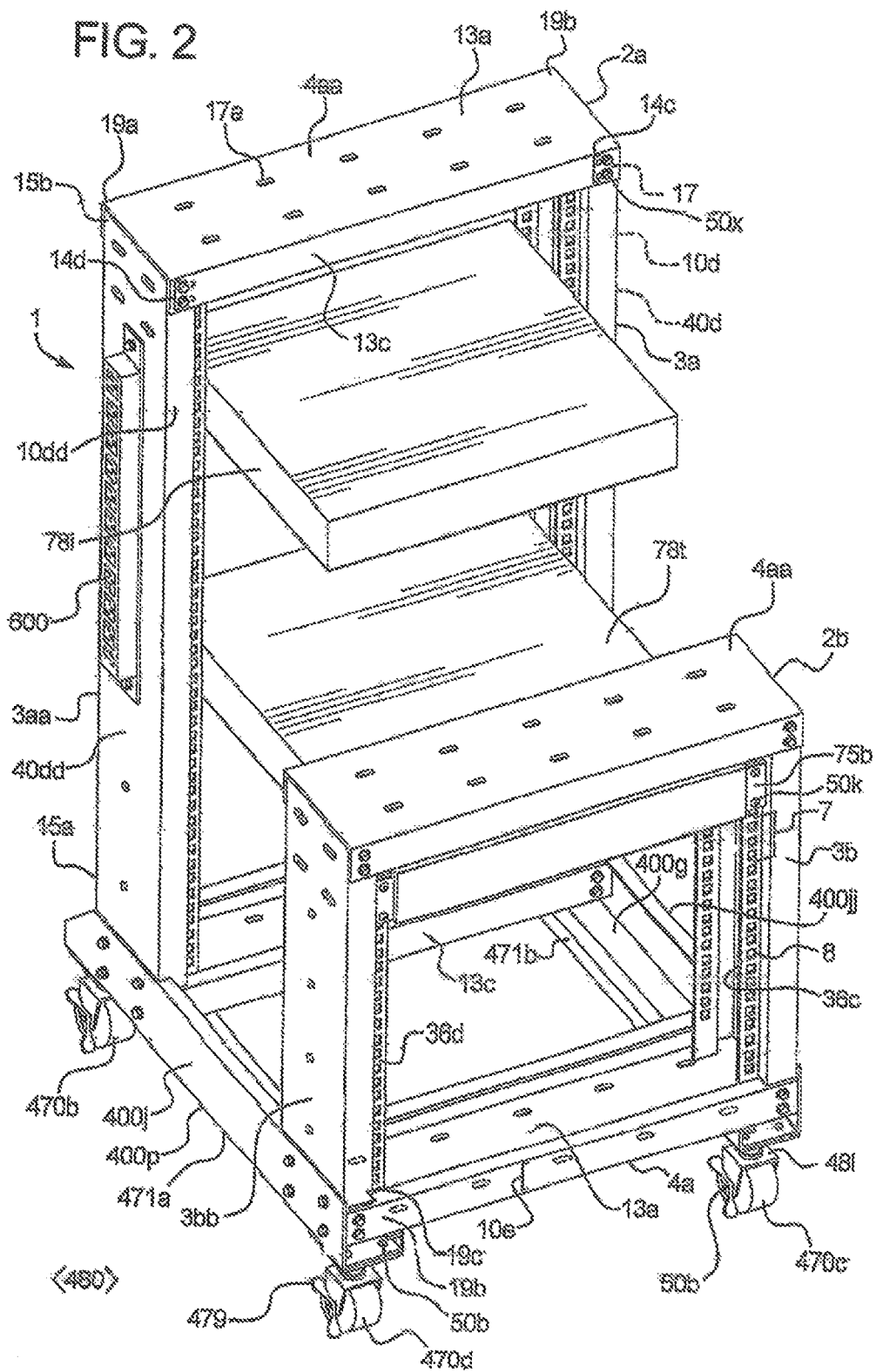

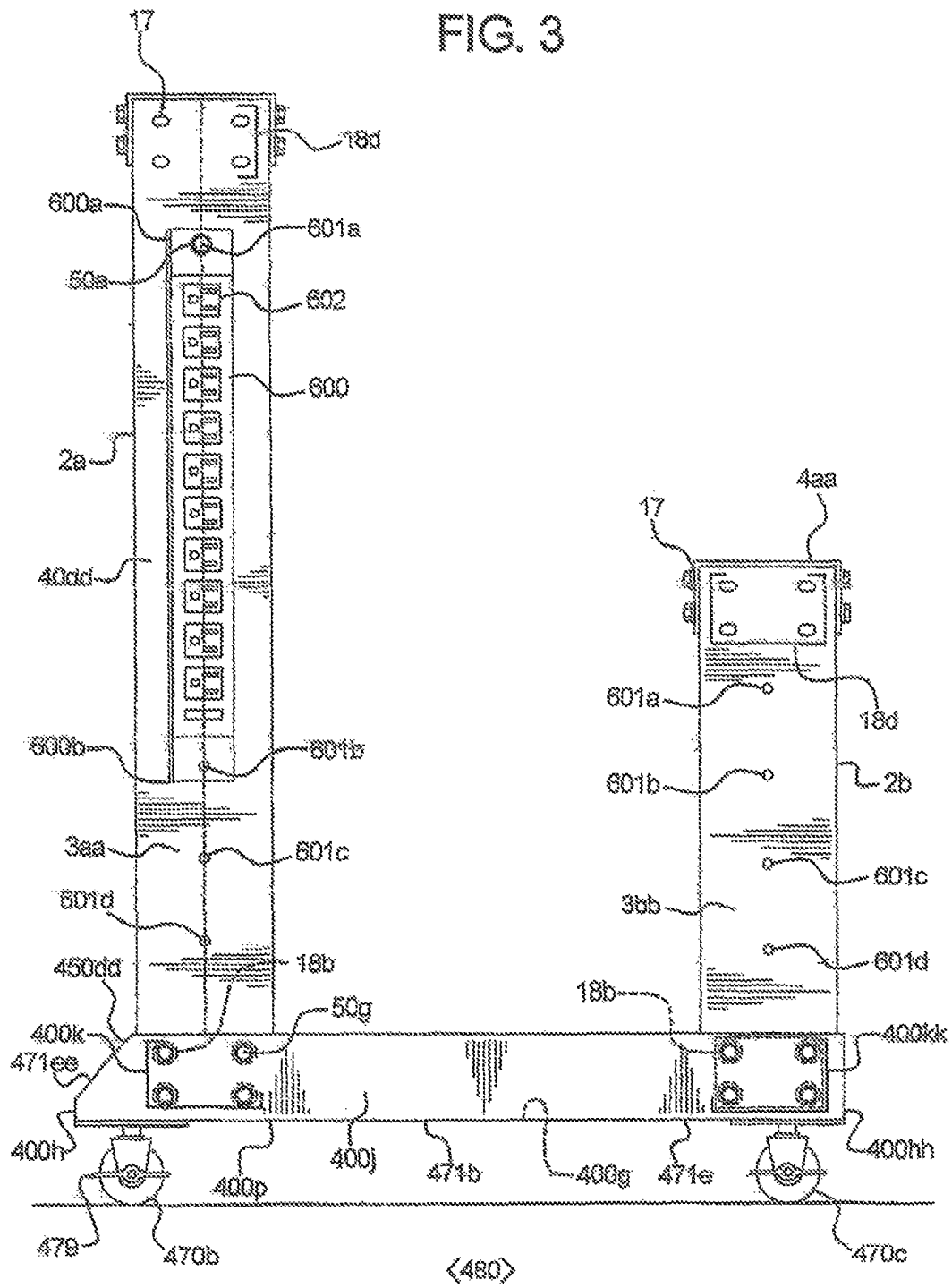

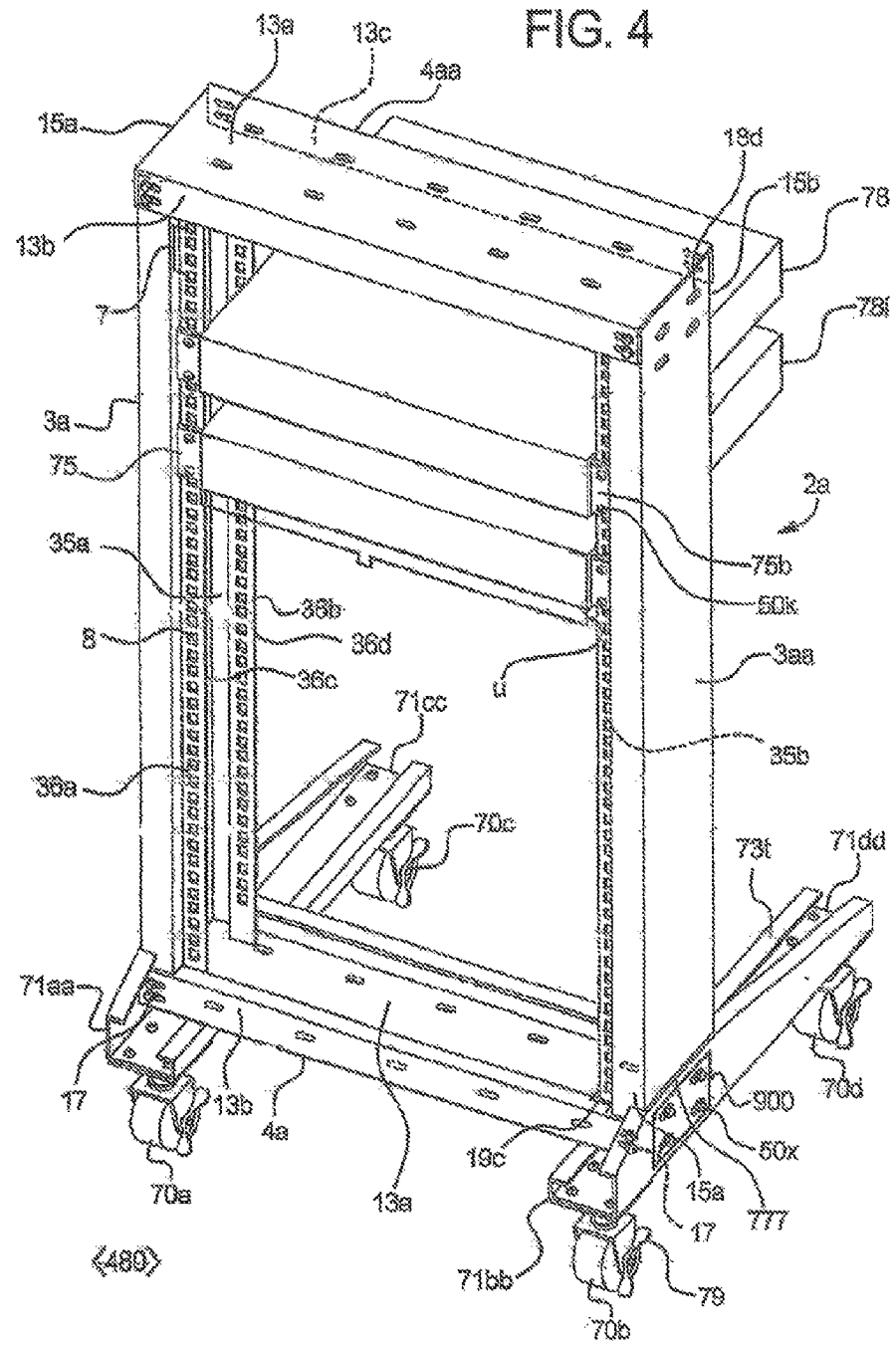

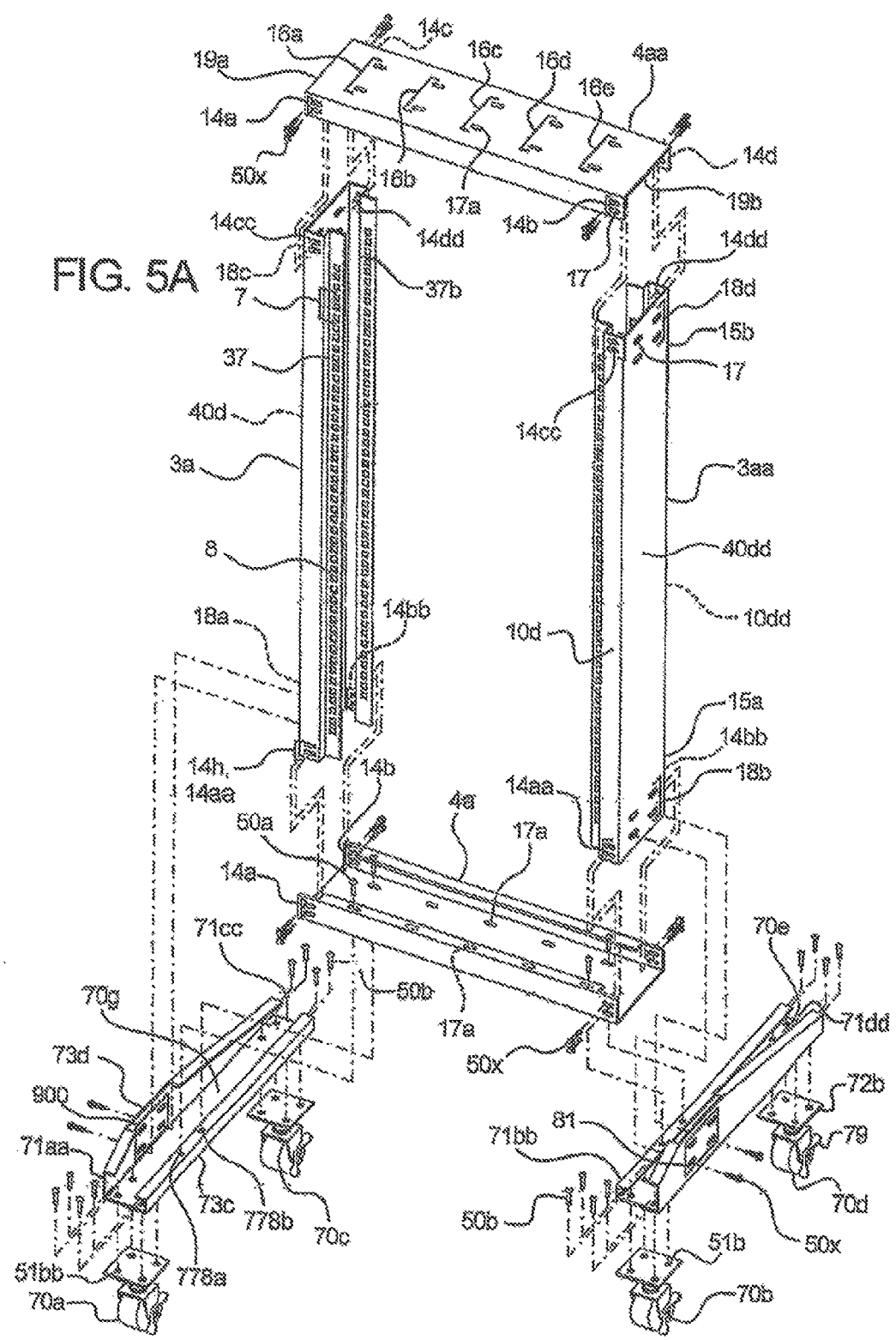

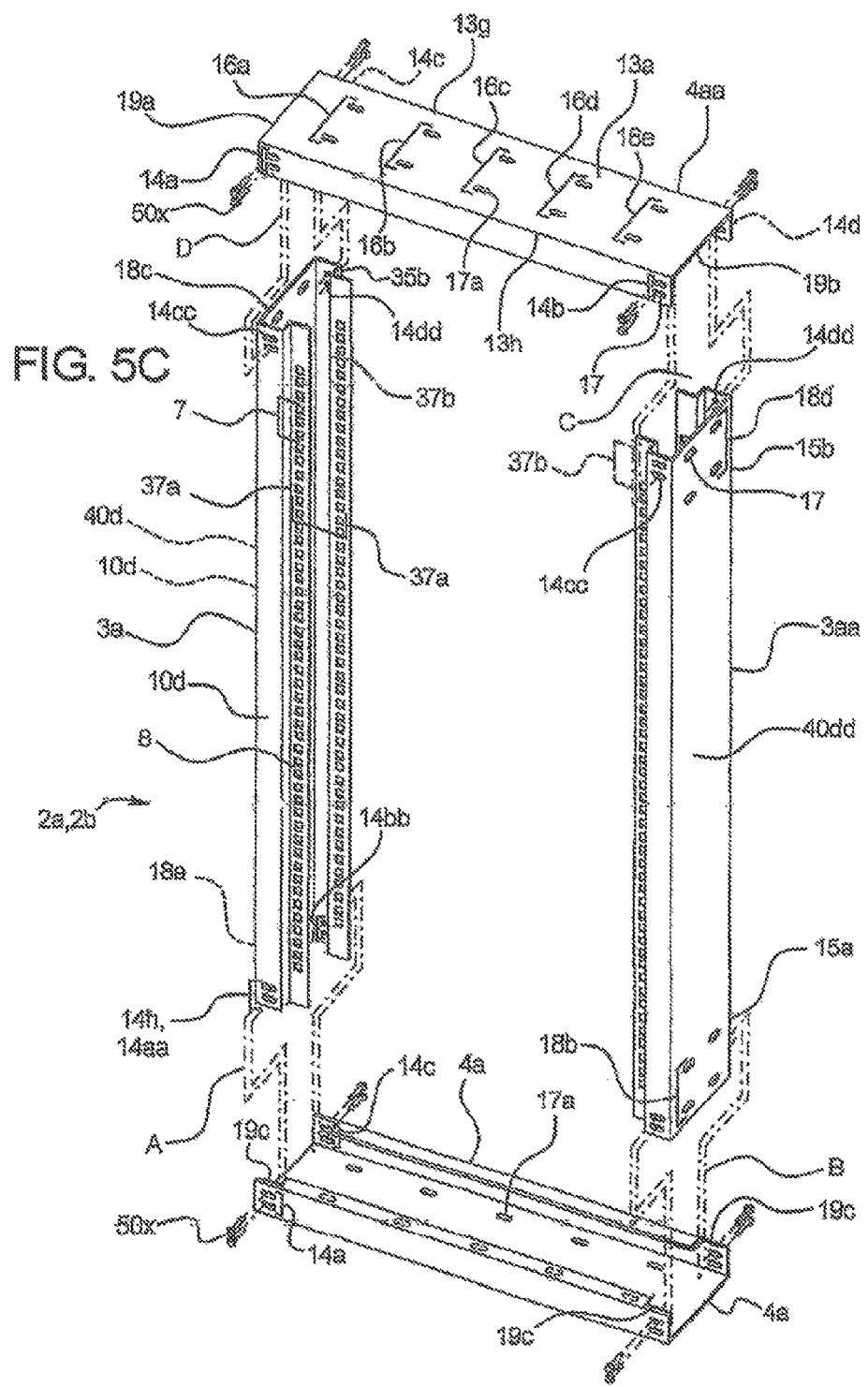

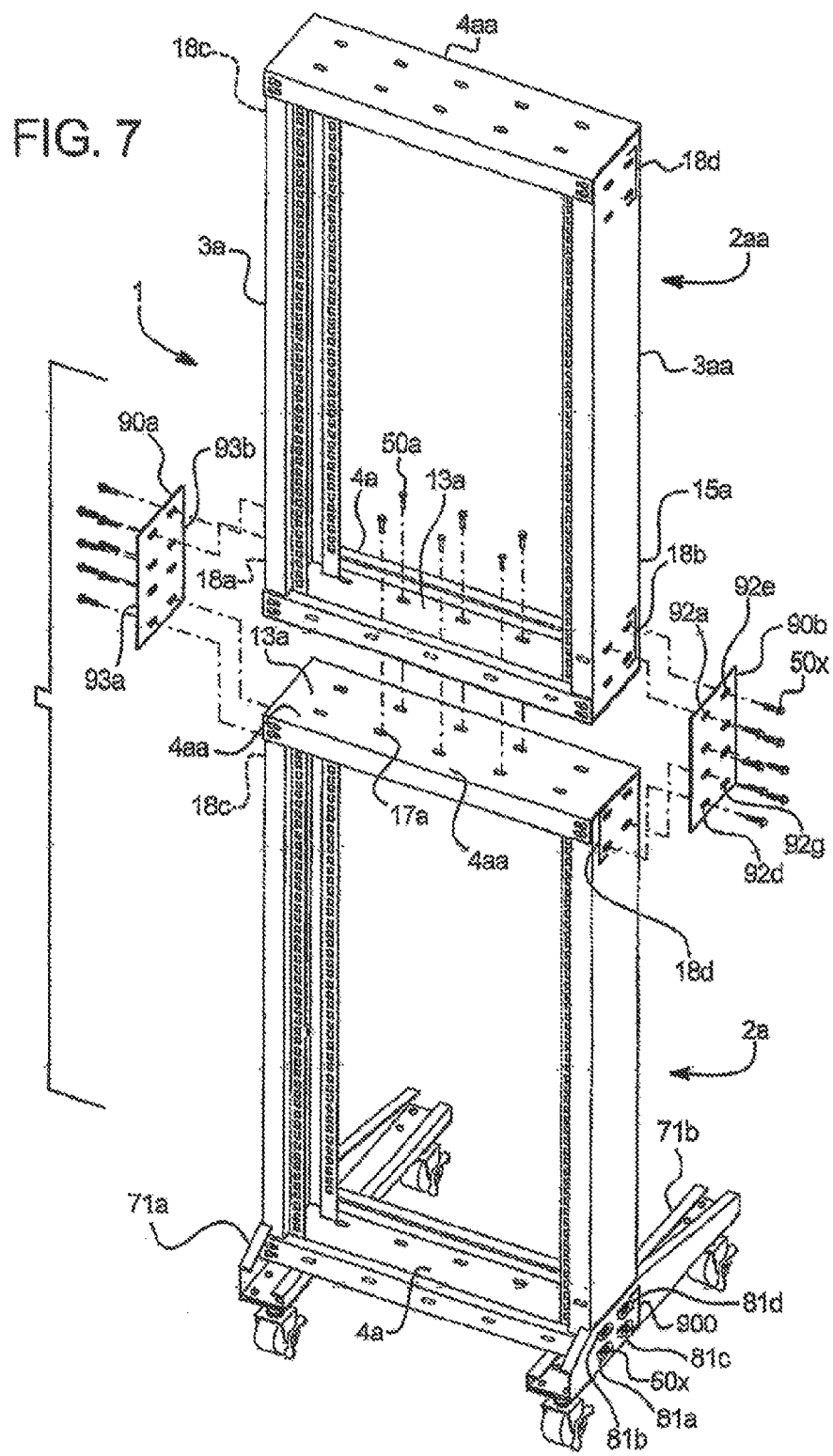

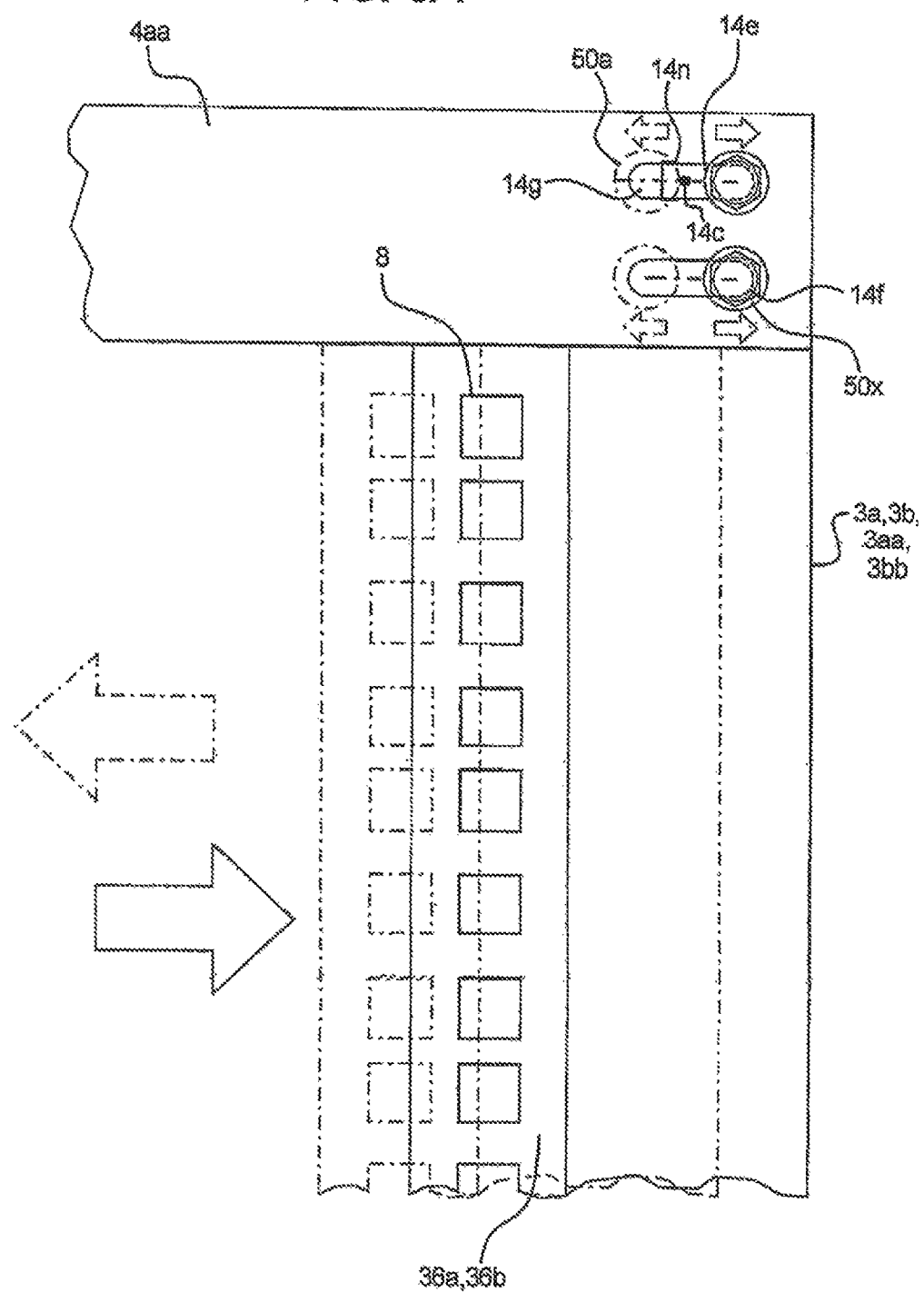

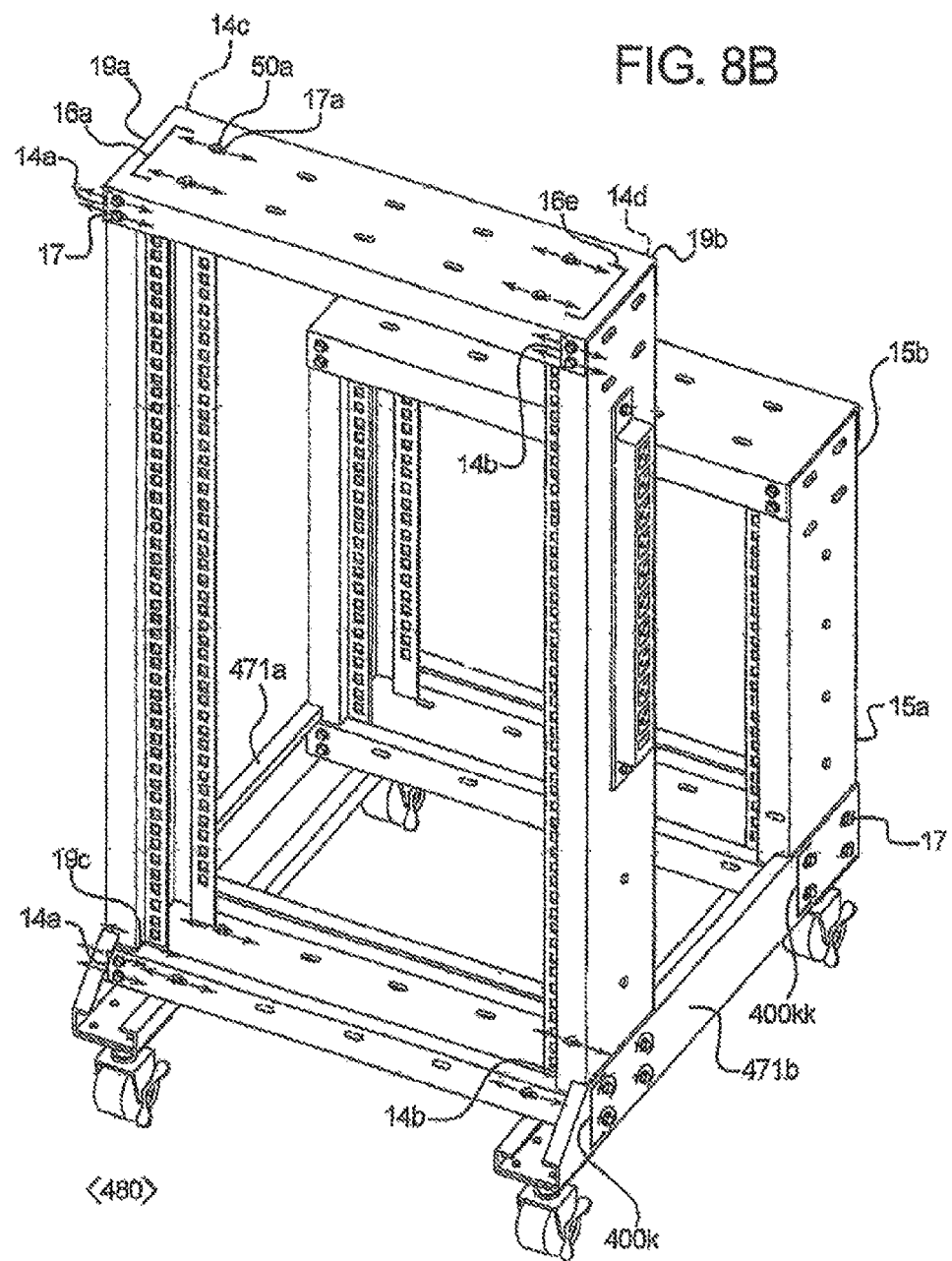

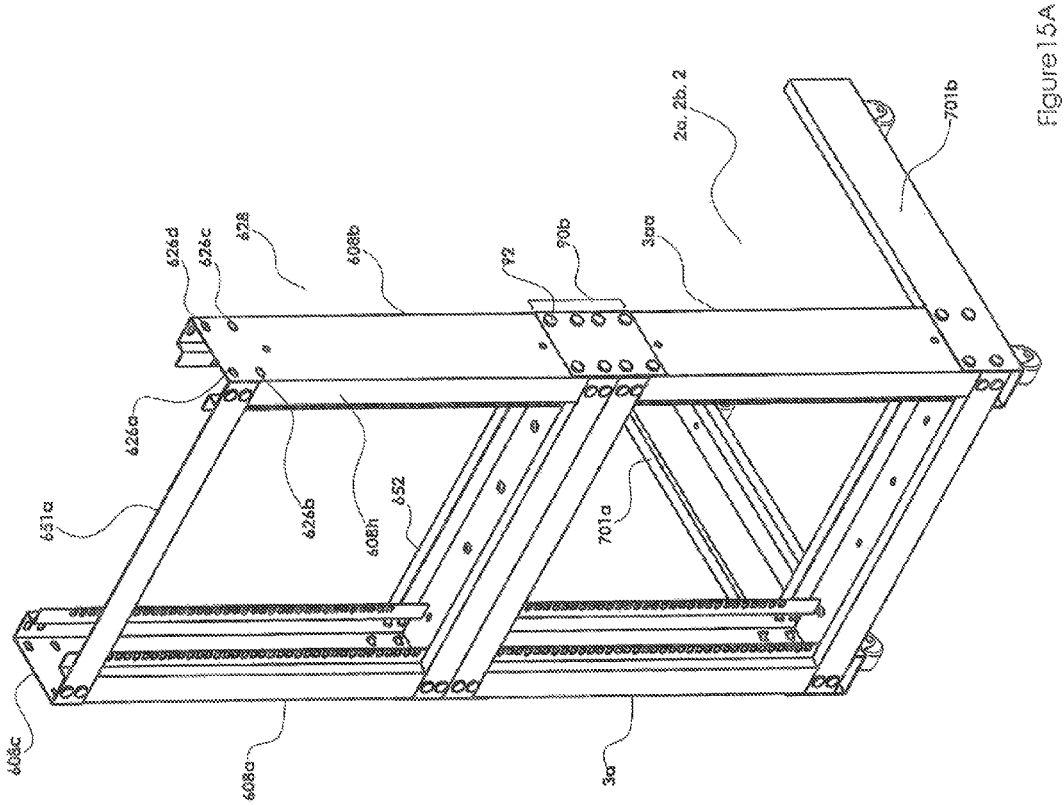

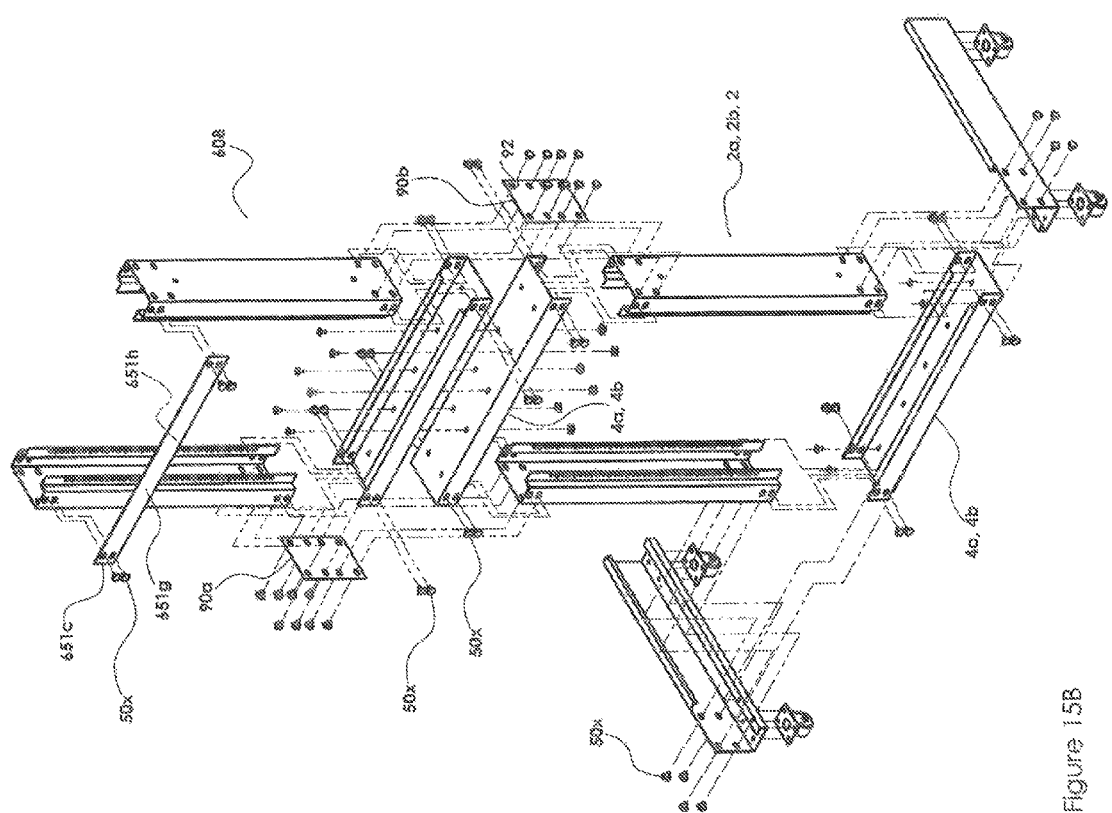

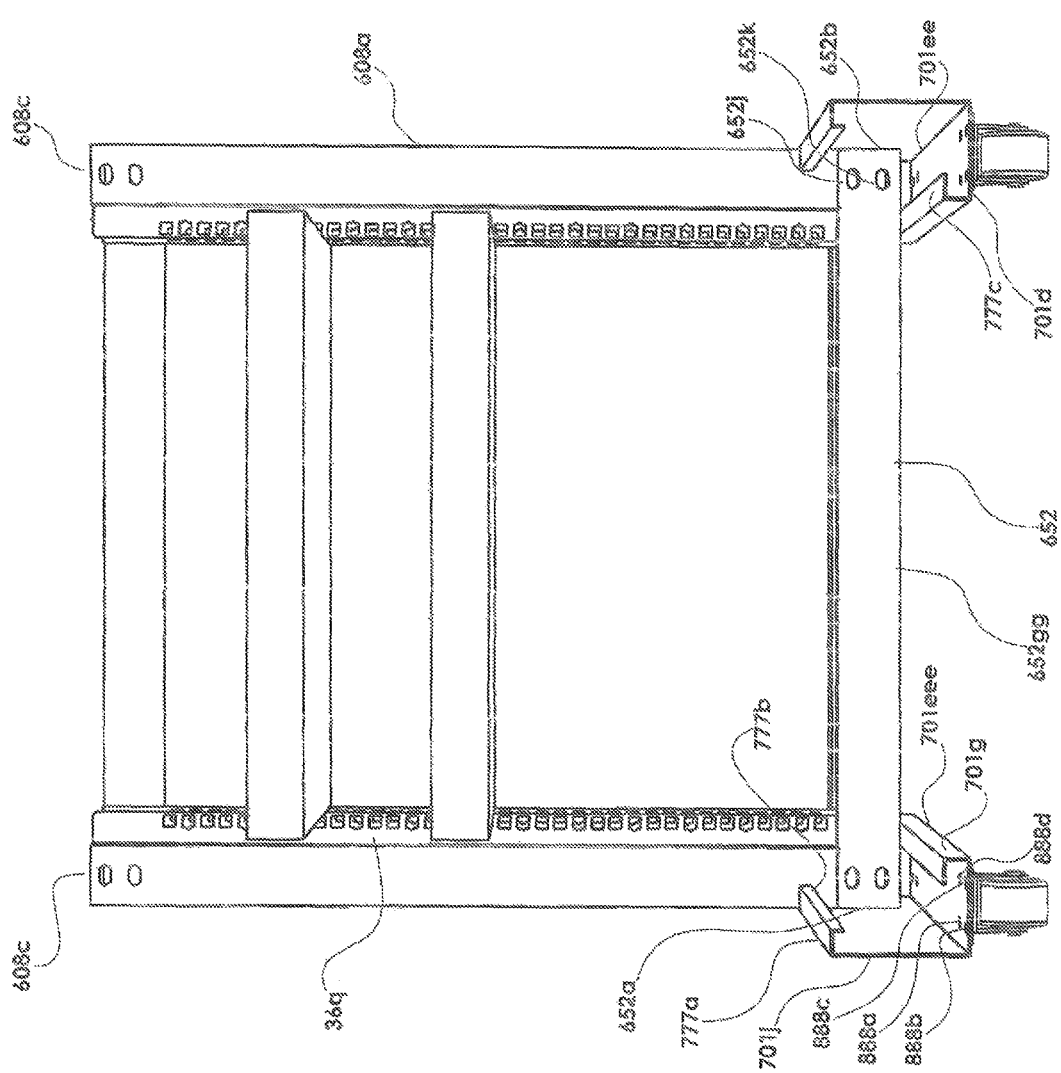

MOUNT RACK FRAME

This application is a continuation in part of pending U.S. utility patent application Ser. No. 14/745,644 filed Jun. 22, 2015 which is a continuation of Ser. No. 13/387,029 filed Apr. 27, 2009, and which is a continuation in part of U.S. utility patent application Ser. No. 11/364,495 filed Feb. 28, 2006 and now abandoned.

BACKGROUND OF THE INVENTION

This invention relates to a second modular mount rack frame for storing computer related devices such as hubs, switches, routers and servers. More particularly this invention relates to a second modular mount rack frame with detachable rigid modular support structures. This second modular mount rack frame also contains connecting plates for vertical attachments, lateral adjustment components and vertically attachment of two individual modular rigid support structures. Furthermore, there are connecting brackets which attach to both mounted devices and modular rigid support structures, thereby effectively stacking them vertically within the frame.

The prior art discloses cabinets for storage of computer related device which are expensive and cumbersome. They also require humidity and temperature controls because of their non-ventilated interior environment. Prior art storage structures also lack flexibility for adjusting the horizontal dimension of the mount rack frame whenever devices deviate from standard horizontal dimensions. Furthermore, because these prior art storage structures are not modular; they cannot stack vertically upon each other in an interchangeable manner. Prior art storage structures also do not exhibit reversibly attached rack bases by which the mount rack frame moves across a flat horizontal surface such as a floor.

The second mount rack frame solves these problems in an economical manner and contains the advantages of the mount rack frame previously described in U.S. utility patent application Ser. No. 11/364,495. With partially elliptical apertures and appropriate mechanical fasteners, the horizontal dimension within a standard mount rack frame is easily manually adjustable. If mobility is desired, each mount rack frame reversibly attaches to a rack base which includes wheels or coasters.

The current mount rack frame comprises numerous prototypes with dimensions which conform to standardized measurements (as well as multiples thereof) of the computer device industry. Because the mount rack frame is modular, additional rigid modular support structures vertically stack upon posterior or first anterior rigid modular support structures for increased storage.

The second mount rack frame accommodates servers as well as hubs, switches, routers which were the subject of U.S. application Ser. No. 11/364,495. This improved second modular mount rack frame comprises larger wider frame components for easier assembly. Second mount rack frame also implements thick bolts with matching self-locking inserted hex nuts. As in the prototypes in U.S. application Ser. No. 11/364,495, now abandoned, modular rigid support structures stack upon each other vertically for additional storage.

My second mount rack frame has up to two sets of rigid vertically aligned components which are spaced to create up to two parallel rigid modular multi-component support structures with parallel horizontal rigid components. The anterior rigid modular multi-component support structure can be taller than the posterior modular unit or vice versa. In this second mount rack frame these rigid modular multi-component rigid support structures may also be the same height, although both attach to two corresponding straight base supports.

The second mount rack frame performs two important functions: It may connect at two opposing anterior points along a server or hub for support solely by two opposing vertical rigid support components. The second mount frame also connects at four points—two anterior and two posterior—along larger devices such as servers. The four point vertically second mount rack frame component can also be vertically expanded by adding interchangeable modular rigid support structures.

None of the prior art prototypes possess the capability for (i) reversible and interchangeable four opposing point and two opposing point support of computer related devices by (ii) the reversible removal of a posterior modular rigid support structure; and thereby (iii) reducing the mount rack frame to one anterior modular rigid support structure for lighter devices. The second mount rack frame comprises the structural capability to support
(i) more than one rigid multi-component support structure in vertical alignment and attachment to
(ii) both laterally aligned rigid multi-component support structures, and
(iii) with or without a maximum load of stored attaching vertically aligned devices.

In a second embodiment of the second mount rack frame a single modular rigid multi-component support structure comprises structural features, preferably aligned aperture pairs and inserted mechanical fasteners, by which to vertically attach another rigid modular rigid support structure. Each such vertically aligned modular rigid support structure is preferably interchangeable with the remaining vertically aligned modular rigid support structure. Each single modular rigid support structure also functions as a mount rack frame, without additional rigid multi-component modular support structure(s), when attached to a mount rack frame base. Each single modular rigid support structure in both the four-point frame and the second embodiment also preferably comprises structural features by which each rigid modular multi-component support structure is adjusted to compensate for mechanical deviations in (i) attaching devices that attach mounted devices to the frame (ii) as well as the mounted devices themselves. This second embodiment of the second mount rack frame may also support more than one additional rigid multi-component support structure in vertical alignment and attachment.

In a third mount rack frame there is an upper rigid horizontal component comprises a single rigid metal strip that attaches to each of two opposing rigid vertical components. There is also a lower rigid horizontal component that (i) attaches to the two opposing rigid vertical components, and (ii) weighs more than the upper rigid horizontal component. The two rigid vertical components directly oppose each other, and each rigid vertical component comprises a longitudinal vertical recess to reduce frame weight. As in the second mount rack frame, each rigid vertical component attaches to each rack base leg along the longitudinal length of the rack base leg in a perpendicular manner. Each rigid vertical component also preferably attaches to each rack base leg along the longitudinal length of each rack base leg in an anterior-posterior configuration. This anterior-posterior attachment of each rigid vertical component provides a free-standing ability to the frame even when the maximum number of stored devices are attached in vertical alignment along the longitudinal length/height of rigid vertical components.

SUMMARY OF THE INVENTION

The second mount rack frame disclosed and claimed herein comprises at least one modular rigid support structure, but this frame can contain at least four modular rigid support structures. Each modular rigid support structure contains at least two rigid interchangeable vertical components and two rigid interchangeable horizontal components, and all of which are assembled to each other within a very short time period. Each rigid horizontal component and rigid vertical component also preferably contains partially elliptical apertures and bolts or screws. These apertures congruently align for horizontal adjustment of rigid vertical components, as well as for mechanical attachment to other rigid components.

The second mount rack frame preferably contains at least two modular rigid support structures. In this preferred embodiment there is a total of four rigid vertical support components, and each modular rigid support structure is easily assembled from interchangeable rigid components. When the second mount rack frame comprises four vertical rigid components, then the second mount rack frame can support servers which range to 40 inches in depth (using 25 inch universal brackets). At least one modular rigid support structure can vertically align and stack upon another rigid modular support structure for additional device support and storage, and without additional floor space.

For all anterior and posterior modular rigid support structures, partially elliptical apertures containing bolts or screws are spaced along the rigid vertical and rigid horizontal components in aperture pairs. Several partially elliptical apertures contain a centrally positioned screw or bolt with a lateral clearance on either side of that screw of preferably and approximately 1/16 inch. As a result, certain screws within specific partially elliptical apertures can move laterally, and this lateral movement results in an adjustable horizontal distance between two opposing rigid vertical components within one modular rigid support structure. Bolts and screws within partially elliptical apertures also attach vertical rigid components to horizontal rigid components.

Other congruently aligning apertures have different functions. For example, rigid horizontal components contain smaller partially elliptical apertures for vertically attaching two modular rigid support structures to each other. Round threaded apertures within rack base legs attach rack base or straight base legs to a single rigid support structure or two module mount rack frames. Partially elliptical apertures within rigid vertical components attach (i) support plates with mechanical fasteners to stacked rigid support structures; and/or (ii) rack base legs to vertical rigid components.

Each modular rigid support structure has a horizontal length and vertical height of one 'U,' or a multiple thereof. A U is the unit of measurement in the computer industry, and each U designates a horizontal width of nineteen and a perpendicular height of one and three-quarters inches (for either an attached device or the actual mount rack frame). A second U standard designates a horizontal length of twenty-four inches, but the nineteen-inch standard is more ubiquitous. Width (depth) of an attached device can vary and still remain within one U (or multiples thereof).

For example, a standard industry measurement of 3 U is equivalent to approximately 1.75×3 inches in height of the attached device (or vertical height interval along each rigid vertical component). Devices attach within each rigid support structure by vertically and linearly aligned apertures and inserted screws along rigid vertical components. There are also two sets of vertically aligned rack apertures along each rigid vertical component. As a result, the user can either attach the device more anterior or posterior along a modular rigid support structure.

In addition, each rigid vertical component end comprises apertures into which bolts or screws reversibly insert to attach a straight base leg. In the second mount rack frame, each straight base leg or rack base leg containing coasters or wheels with locking mechanisms and the same is true for the left and right rack base leg of the third mount rack frame. These coasters or wheels provide mobility to the mount rack frame or single modular rigid support structure.

Each rigid horizontal component is interchangeable structurally and functionally with all other rigid horizontal components of the same length and width. Consequently, in the second mount rack frame any rigid horizontal component can function as an upper horizontal component or a lower horizontal component of a modular rigid support structure with respect to a supporting flat surface such as a floor. Each rigid vertical component end contains partially elliptical apertures for (i) attaching a connecting plate to a two-module mount rack frame, or (ii) reversibly attaching a rack base to a rigid support structure.

To increase the storage capacity of the mount rack frame, one modular rigid support structure is stacked and aligned vertically upon the other. Since each modular rigid support structure is identical in structure and function to the other, all rigid support structures function either as the bottom or upper (stacked) modular unit. Rigid flat connecting plates, as well as additional bolts or screws, along the corresponding rigid vertical components reversibly attach an upper aligned rigid support structure upon the supporting lower modular rigid support structure.

The anterior modular rigid support structure of the four point second mount rack frame is preferably taller than the posterior rigid support structure, but they are of the same horizontal dimension. In other embodiments the posterior rigid support structure may be taller than the anterior modular rigid support structure, as anterior and posterior positions along straight base legs are reversible and interchangeable.

The anterior modular rigid support structure in combination with posterior modular rigid support structure of the second mount rack frame is designed for attachment of computer-related devices which require four point anterior/posterior attachments for adequate support. In this particular application, two anterior opposing points along opposing sides a computer related device attach to a first anterior modular rigid support structure. Simultaneously two posterior opposing points along opposing posterior sides of the same computer related device attach to the posterior modular rigid support structure.

In the preferred embodiment of the second mount rack frame, preferably both anterior and posterior rigid modular support structures are parallel to each other and attach to a first and second corresponding straight base legs to form a square or rectangle. For other embodiments, the reversibly attached first posterior modular rigid support structure is easily removed from the first anterior modular rigid support structure. When so removed, the posterior modular rigid support structure becomes the smaller lightweight and less cumbersome unit which accommodates smaller computer related devices as well as smaller budgets. None of the embodiments of this second laterally attaching frame requires attachment or support to another structure or feature that is external to the frame to be free-standing with or without attached stored devices in vertical alignment, except for contact along the bottom of the frame with a flat surface.

In the second embodiment the second mount rack frame, a single rigid multi-component modular support structure that reversibly attaches to a rack base. This rack base preferably comprises a first single straight rigid rack base leg and a second single straight rigid rack base leg. The single rigid multi-component modular support structure includes structural features by which (i) To reversibly vertically align with and attached to at least one additional rigid multi-component modular support structure; and (ii) To reversibly adjust a linear dimension of each rigid multi-component modular support structure, and (iii) To interchangeably attach each one of the rigid multi-component modular support structures to the rack base so each individual rigid multi-component support structure has utility as a mount rack frame without vertical attachment or alignment of other rigid multi-component support structures.

A third preferred embodiment of the mount rack frame comprises two rigid horizontal components, two rigid vertical components, a single left rack base leg and a single right rack base leg. The two rack base legs oppose and are parallel to each other with respect to each rack base leg longitudinal length. Each rack base leg longitudinal length is also quantitatively greater than the rack base leg's width or thickness. Each rack base leg has a preferred weight, and each rigid vertical component and rigid horizontal component also have a preferred weight, width, longitudinal length and thickness.

For this third embodiment the rigid upper horizontal component comprises a single metal strip that attaches to each of two opposing rigid vertical components in a perpendicular manner. The lower positioned rigid horizontal component comprises a co-extensive lower longitudinal recessed surface that includes preferably at least four, and preferably five, aligned equidistantly spaced aperture pairs. With these aligned aperture pairs and inserted mechanical fasteners, this frame can vertically align with and attach to a rigid multi-component support structure of the second mount rack frame whenever its rack base legs are omitted. In sum, this third frame exhibits some modular utility whenever a single rigid multi-component support structure with interchangeable rigid horizontal component serves as the storage unit attaching directly to a rack base.

Each longitudinal rack base leg for all disclosed embodiments comprises four apertures configured as a square for (i) attaching a rigid vertical component along the rack base leg in a perpendicular manner (ii) with corresponding inserted mechanical fasteners, and most preferably bolts.

Each rigid vertical component attaches to a corresponding rack base leg at a distance from the anterior end of each rack base leg at which (i) the mount rack frame is free-standing and (ii) does not require support or attachment for features or devices external to the frame (iii) except for contact along its bottommost surfaces or coasters/wheels with a horizontal surface.

Accordingly, it is a purpose of the present invention to provide an economical manner in which to store both heavy and lightweight computer-related devices without the use of shelves.

It is also a goal of the present invention to provide an economical manner in which to store computer-related devices mounted to a mount frame rack at two and/or four points of attachment.

It is also a goal of the present invention to provide reversibly attached modular rigid support structures for storage of vertically aligned electronic devices.

It is also a goal for the present invention to provide base legs with coasters or wheels which attach to modular rigid support structures.

It is another goal of the present invention to provide a device for adjusting a linear dimension of a modular rigid support structure.

It is another goal of the present invention to provide mechanical attachments by which a modular rigid support structure is vertically aligned upon another modular rigid support structure.

It is another goal of the present invention to provide modular rigid support structures which are structurally and functionally interchangeable with respect to vertical stacked alignment and attachment to a rack base leg or a straight base leg.

It is another goal of the present invention to provide a mount rack frame in all embodiments which is free-standing and self-balancing without attachment or support from other structural features, except for contact of a bottom rack base, coasters, or wheels with a horizontal surface It is another goal of the present invention to provide a mount rack frame in which a single storage unit is lighter in weight and free standing whenever it supports mounted devices in vertical alignment.

It is another goal of the present invention to support vertically aligned stored devices without attachment or support to structures or features external to any embodiment of the mount rack frame.

These features, as well as other improvements of the present invention, are apparent after review of the attached figures and DETAILED DESCRIPTION OF THE PREFERRED EMBODIMENT, BEST MODE AND OTHER EMBODIMENTS.

BRIEF DESCRIPTION OF THE DRAWINGS

FIG. 2 is a partial posterior view of the second mount rack frame of FIG. 1.

FIG. 3 is a lateral view of the second mount rack frame of FIG. 1.

FIG. 4 is a partial anterior view of another embodiment of the second mount support rack with mounted devices.

FIG. 5A is an exploded view of an anterior modular rigid support structure and rack base legs.

FIG. 5C is an exploded view of the preferred modular rigid support structure.

FIG. 7 is an exploded view of second posterior modular rigid support structure in an upper aligned position upon first posterior modular rigid support structure.

FIG. 8A is an isolated close up schematic anterior view of the lateral movement of bolts within partially elliptical apertures.

FIG. 8B is a partial anterior view of the preferred embodiment of FIG. 1 with bolts moved laterally.

FIG. 15A is a partial anterior view of the mount rack frame of FIG. 9 attaching to a rigid modular multi-component support structure.

FIG. 15B is an exploded view of the mount rack frame of FIG. 15A.

FIG. 18 is a posterior perspective view of the mount rack frame of FIG. 9.

DETAILED DESCRIPTION OF THE PREFERRED EMBODIMENT, BEST MODE AND OTHER EMBODIMENTS

Preferred Embodiment of Second Modular Mount Rack Frame 1

Figure 1:
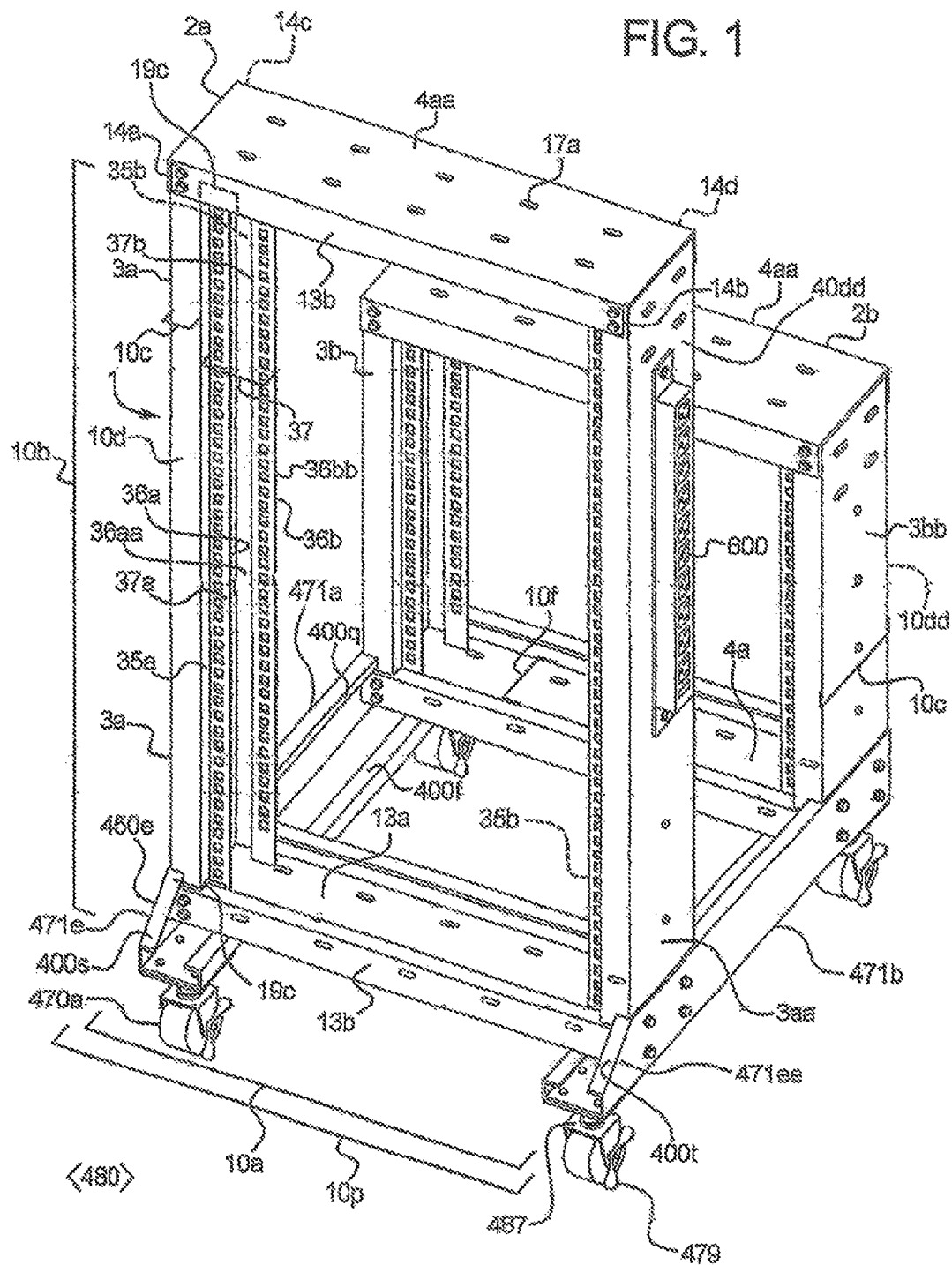
FIG. 1 is a partial anterior view of the preferred embodiment of the second mount rack frame.

Referring initially to FIG. 1, the preferred embodiment of the second modular mount rack frame 1 comprises a first anterior modular rigid support structure 2a and a first posterior modular rigid support structure 2b (generally modular rigid support structures 2). Second modular mount rack frame 1 rests upon a flat horizontal surface 480 such as a floor. First anterior rigid support structure 2a and first posterior rigid support structure 2b preferably differ in vertical height 10b, but have the same depth 10c. All modular rigid support structures 2 are identical in structural features and design to each other, but with U sizes ranging from 12 through 40. The preferred embodiments and other embodiments of second modular mount rack frame 1 are free-standing. These embodiments do not require support from structures exterior to mount rack frame 1 to support vertically aligned stored devices 78 except for contact of lowermost rack base leg surfaces 606a, 606b or coasters and wheels 470 with a horizontal surface 480.

Referring again to FIG. 1, first anterior modular rigid support structure 2a is preferably greater in vertical height 10b than posterior modular rigid support structure 2b. However, first anterior modular rigid support structure 2a has the identical effective horizontal dimension 10a as first posterior modular rigid support structure 2b, and all modular rigid support structures 2 in other embodiments. Effective horizontal dimension 10a is preferably approximately nineteen inches. Each first anterior modular rigid support structure 2a or first posterior modular rigid support structure 2b can support (i) mounted devices 78 and (ii) at least one additional vertically stacked rigid support structure 2aa, 2bb or other modular rigid support structure 2.

The discussion below addresses a first anterior modular rigid support structure 2a within the preferred embodiment. However, the components, design and structure of first posterior and anterior modular support structures 2a, 2b are identical. The components, design and structure of other modular rigid support structures 2 in other embodiments is also identical to modular support structure 2a. The vertical dimension 10b and depth 10c of modular rigid support structures 2 may vary in other embodiments, although (i) effective horizontal length 10a of each modular rigid support structure 2 is always preferably approximately nineteen inches, and (ii) total horizontal length 10p is preferably always approximately twenty-three inches.

a. Modular Rigid Support Structures 2 of Second Mount Rack Frame

Referring to FIGS. 1 and 2 of the preferred embodiment, first anterior modular rigid support structure 2a comprises first rigid vertical component 3a and second rigid vertical component 3aa [generally rigid vertical components 3]. Rigid vertical components 3a, 3aa directly oppose each other at a 180-degree angle in an assembled rigid modular support structure 2a, 2b, or any other modular rigid support structures 2.

Vertical longitudinal height 10b of each vertical rigid component 3a, 3aa is approximately 49 inches. Each rigid vertical component 3a, 3aa has an anterior vertical width side 10d and a posterior vertical width side 10dd of preferably approximately two inches. Each vertical rigid component 3a, 3b has a first and second lateral vertical side 40d, 40dd respectively, and each lateral vertical side has depth 10c of approximately four and three-quarters inches. For first posterior modular rigid support structure 2b, vertical height 10b of each first and second vertical rigid component 3b, 3bb is approximately thirty-nine inches. When assembled into modular rigid support structure 2 each rigid vertical support structure is perpendicular to flat support surface 480 and horizontal components 4.

Each lateral vertical component side 40d, 40dd is perpendicular to, and integrally attached, to anterior or posterior rigid vertical component surfaces 10d, 10dd respectively. Each anterior width side 10d and posterior width sides 10dd comprise the same posterior side/anterior side/lateral side dimensions. Preferably each first rigid vertical component 3a is the same vertical height as second rigid vertical component 3aa within one assembled anterior rigid modular support structure 2a. The same relationship is preferred for posterior vertical components 3b, 3bb or other embodiments. Referring to FIG. 3 of the preferred embodiment, each lateral vertical side 40d, 40dd contains four round penetrating apertures 601a, 601b, 601c, 601d [generically round penetrating apertures 601]. Round penetrating apertures 601 linearly and vertically align with each other along lateral vertical side 40d or 40dd. Referring to FIGS. 1 and 4, each rigid vertical component 3a, 3aa, 3b, 3bb comprises first and second vertical interior surfaces 35a, 35b respectively. Each vertical interior surface 35a, 35b is approximately three-quarters inch in width.

Preferably first anterior vertical rigid components 3a, 3aa are interchangeable with each other, while first posterior vertical rigid components 3b, 3bb are interchangeable with each other (assuming components 3a, 3aa, or 3b, 3bb exhibit identical width and depth). Vertical rigid components 3a, 3aa may not be interchangeable with components 3b, 3bb, if corresponding widths and depths diverge. Vertical rigid components 3a, 3aa, 3b, 3bb within their corresponding modular rigid support structures 2a, 2b respectively are aligned in a fixed, yet reversible mechanical manner. Each vertical rigid component 3a, 3aa, 3b, 3bb is positioned perpendicular to a flat supporting surface 480 as well as to (i) attaching straight base legs 471a, 471b; or (ii) attaching rack base legs 71a, 71b infra.

b. Rigid Horizontal Components 4a, 4Aa,

Referring to FIGS. 1 and 2 of the preferred embodiment of the second mount rack frame 1, first anterior modular rigid support structure 2a also comprises first rigid horizontal component 4a and second rigid horizontal component 4aa. Rigid horizontal components 4a, 4aa are parallel to each other within assembled rigid modular support structure 2a, 2b, or other modular support structure 2. Rigid horizontal components 4a, 4aa, or those in other embodiments 4 are also parallel to the flat supporting surface 480 when assembled within rigid modular support structure 2a, 2b or other modular rigid support structure 2.

Referring to FIG. 1, each first and second anterior rigid horizontal component 4a, 4aa respectively, as well as each anterior first and second posterior rigid horizontal component 4b, 4bb respectively, is approximately twenty-three and five-eighths inches in total length 10a. The effective lateral horizontal length 10a is preferably nineteen inches, because nineteen inches is the industry standard lateral horizontal length 10a to accommodate a single U mounted device 78. Each rigid horizontal component 4a, 4aa, or 4b, 4bb is approximately four and seven-eighths inches in horizontal width 10f. First and second anterior rigid horizontal components 4a, 4aa respectively are preferably parallel to each other when assembled into modular rigid support structure 2. Similarly, first and second posterior rigid horizontal components 4b, 4bb respectively are parallel to each other when assembled into first posterior modular rigid support structure 2b or in other embodiments 2. Each first and second horizontal rigid component 4a, 4aa, 4b, 4bb respectively is structurally and functionally interchangeable with the other.

Referring to FIGS. 1 and 2, at each horizontal rigid component end 19a, 19b is cut away section 19c. One rigid vertical component end 15a or 15b inserts within a corresponding cutaway section 19c. Each rigid horizontal component 4a, 4aa, 4b, 4bb also comprises a corresponding horizontal bottom side 13a. Horizontal bottom side 13a integrally and continuously attaches perpendicular to first downward side 13b and second downward side 13c. Each downward first and second downward side 13b, 13c respectively is approximately two inches in downward width 10e.

Horizontal side 13a and downward sides 13b, 13c are preferably approximately 1/16 to 3/32 inch in thickness. Rigid vertical component ends 15a, 15b insert and slide in a limited manner along horizontal bottommost side 13a within corresponding cutaway section 19c. Each rigid vertical component 3a, 3aa of first anterior modular rigid support structure 2a is reversibly removable from anterior horizontal rigid components 4a, 4aa. Similarly, each rigid vertical component 3b, 3bb of first posterior modular rigid support structure 2b is reversibly removable from posterior horizontal rigid components 4b, 4bb respectively. In other embodiments rigid vertical components 3 are reversibly removable from corresponding horizontal rigid components 4.

Anterior first and second rigid vertical components 3a, 3aa respectively are parallel to each other when assembled within first anterior modular rigid support structure 2a. Anterior first and second rigid horizontal components 4a, 4aa respectively are parallel to each other and attach at a right angle to vertical rigid components 3a, 3aa respectively when assembled as first modular rigid support structure 2a. Components 3a, 3aa, 4a, 4aa thereby preferably form a rectangle or square within one plane, as do components 3b, 3bb, 4b, 4bb in a posterior rigid modular support structure 2b, or other embodiment of rigid modular support structures 2 with components 3, 4. However, other four-sided polygons and other two-dimensional or three-dimensional shapes are also within the scope of the invention.

c. Partially Elliptical Apertures 17,17a

Referring to FIG. 5C, each rigid vertical component 3a, 3aa, or 3b, 3bb contains vertically aligned aperture pairs 14aa, 14bb, 14cc, 14dd (generically vertical pairs 14h) of large partially elliptical apertures 17. Vertical aperture pairs 14h are located within first and second vertical components end 15a, 15b along vertical sides 10d, and 10dd. As best seen in FIG. 8A, in the preferred embodiment each large partially elliptical aperture 17 within aperture pairs 14h has an aperture longitudinal axis 14e perpendicular to vertical height 10b of corresponding rigid vertical component 3a, 3b. Each large partially elliptical aperture 17 comprises midpoint 14c along aperture longitudinal axis length 14e. Each large partially elliptical aperture 17 within vertical pair 14h is preferably approximately (i) seven-sixteenths inch in aperture longitudinal axis length 14e and (ii) one-quarter inch in aperture height 14n. However, other aperture shapes and dimensions are also within the scope of the invention.

Each large partially elliptical aperture 17 provides a lateral clearance of 1/16 inch on each side of an inserted bolt 50x. Each large partial elliptical aperture 17 is designed to reversibly receive one threaded bolt 50x. Threaded bolt 50x preferably has a maximum hexagonal head dimension of five-eighths inch, a threaded stem with mated hex nut (not seen) and a washer (not seen). Threaded stem is approximately one-quarter inch in diameter and three-quarters inch in length. There is a maximum lateral clearance of approximately 1/16-inch on each side of a centrally positioned threaded bolt 50x along aperture long axis 14e. There is also a maximum lateral clearance of approximately 1/16 inch on each side of a centrally positioned large round threaded screw 50a within smaller partially elliptical aperture 17a, or in other embodiments. Preferably large round threaded screw 50a has a diameter of approximately one-half inch and a stem diameter of approximately three-sixteenths inch and includes a circular washer (not seen).

Vertical aperture pairs 14h (4aa, 14bb, 14cc, 14dd) are positioned at rigid vertical component ends 15a, 15b within corresponding first and second rigid vertical component anterior and posterior vertical sides 10c, 10d respectively. Two partially elliptical apertures 17 within each pair 14h align directly above or below each other within corresponding anterior vertical side 10d or posterior vertical side 10dd. Still referring to FIG. 5C, each rigid horizontal component 4a, 4aa, 4b, 4bb, or other rigid horizontal components 4 in other embodiments, comprises first, second, third and fourth horizontal aperture pairs 14a, 14b, 14c, 14d respectively (generically horizontal aperture pairs 14). Each horizontal aperture pair 14 is located at first and second horizontal component ends 19a, 19b respectively, within first and second horizontal downward sides 13b and 13c respectively. Each horizontal aperture pair 14 comprises two large partially elliptical apertures 17.

Each large partially elliptical aperture 17 within a horizontal pair 14a, 14b, 14c, 14d (generically horizontal pairs 14) is identical in shape and dimension to large partially elliptical apertures 17 within vertical pairs 14h. Each aperture long axis 14e within aperture pairs 14 is parallel to the effective longitudinal length 10a of its corresponding rigid horizontal component 4. Within an assembled modular rigid support structure 2a, 2b or other structures 2, each horizontal aperture pair 14 congruently aligns with corresponding vertical aperture pair 14h, i.e.: 14a, 14aa, 14b, 14bb, etc.

Still referring to FIG. 5C, in the preferred embodiment first, second, third, fourth and fifth horizontal pairs 16a, 16b, 16c, 16d, and 16e respectively (generically laterally aligned pairs 16) of smaller partially elliptical apertures 17a penetrate horizontal central side 13a. Each smaller partially elliptical aperture 17a is identical in design and shape to large partially elliptical aperture 17, so that each smaller partially elliptical aperture 17a has an aperture midpoint 14c and an aperture height 14n (not seen). Each large partially elliptical aperture 17 also has an aperture longitudinal axis 14e (not seen) perpendicular to longitudinal vertical height 10b of corresponding rigid vertical component 3a, 3b or 3.

Horizontally aligned pairs 16 are equidistantly spaced from each other and are parallel to each other. Other numbers of laterally aligned pairs 16 containing smaller partially elliptical apertures 17a are also within the scope of the invention. In other embodiments of the second mount rack frame horizontally aligned pairs 16 and apertures 17a comprise diverse shapes and dimensions, as well as other linear distances between each adjacent apertures or aperture pairs. Preferably adjoining laterally aligned pairs 16 each lie approximately (i) four inches from each other, and (ii) one and one-quarter inches from each first and second rigid horizontal component longitudinal edges 13h, 13g respectively (measured from the closest smaller partially elliptical aperture 17a to longitudinal edge 13h, 13g). Each laterally aligned pair 16 is parallel to, and linearly aligned with, remaining laterally aligned pairs 16 within horizontal central side 13a.

Referring now to FIG. 7, one large round screw 50a inserts within each corresponding smaller partially elliptical aperture 17a of laterally aligned pairs 16. There is a maximum lateral clearance of approximately 1/16-inch along aperture longitudinal axis 14e on each side of a centrally positioned large round screw 50a within smaller partially elliptical aperture 17a. Referring again to FIG. 5C, in the preferred embodiment first and second square vertical aperture sets 18a,18b respectively (generically square vertical sets 18) each comprise four large partially elliptical apertures 17. Each large partially elliptical aperture longitudinal axis 14e is perpendicular to longitudinal vertical length 10b of corresponding rigid vertical component 3.

Each square vertical aperture set 18a, 18b is located within a rigid vertical component end 15a, 15b along a corresponding first or second lateral vertical component side 40d, 40dd. Within each square set 18, four large partially elliptical apertures 17 form a square within a corresponding lateral vertical component side 40d, 40dd. However, other numbers or shapes of large partially elliptical apertures 17 are also within the scope of the invention. One threaded bolt 50x inserts into two aligned elliptical apertures 17 whenever square set 18 congruently aligns with corresponding partially elliptical aperture 17a in other components. Square sets 18a, 18b have three functions: (i) insertion points for threaded bolts 50x which attach flat rigid connector plates 90 to vertical rigid components 3 infra; (ii) attachment of anterior and posterior modular rigid support structures 2a, 2b respectively to first and second straight base legs 471a, 471b respectively; and (iii) attachment of first anterior and posterior second modular rigid support structures 2a, 2b respectively to first and second rack base legs 71a, 71b respectively.

d. Stamped Metal Strips 36a, 36b

Referring to FIG. 1 of the preferred embodiment, each rigid vertical component 3a, 3aa, 3b, 3bb, or other 3, comprises one stamped pair 37 of first and second stamped metal strips 36a, 36b respectively (generically stamped metal strips 36). Each first and second stamped metal strip 36a, 36b respectively preferably integrally attaches to first and second interior vertical component surfaces 35a and 35b respectively.

First and second stamped metal strips 36a, 36b respectively are parallel to each other along longitudinal vertical length 10b of corresponding rigid vertical component 3a, 3aa, 3b, 3bb, 3. Stamped metal strips 36a, 36b are preferably approximately three inches apart from each other along their entire longitudinal vertical lengths 10b. First stamped metal strip 36a is preferably approximately three-quarters inch from rigid vertical component edge 35a in an anterior/posterior direction. Similarly, second stamped metal strip 36b is approximately three-quarters inch from rigid vertical component edge 35b in an anterior/posterior direction. Each stamped metal strip 36a, 36b is preferably approximately 1/16 to 3/32 inch in thickness. First and second stamped interior edges 36c, 36d respectively preferably integrally attach to corresponding first and second interior vertical component surfaces 35a, 35b respectively. Each stamped metal strip 36a, 36b protrudes from, and is perpendicular to, corresponding vertical segment surface 35a or 35b. Each vertical interior surface 35a, 35b is perpendicular to its corresponding crimped metal strip 36a, 36b which attaches thereto.

Still referring to FIG. 1, each first and second stamped metal strip 36a, 36b respectively also comprises a first or second exterior edge 36aa, 36bb respectively. Preferably stamped metal strips 36a, 36b are identical in design and structure. Preferably, stamped metal strips 36a, 36b are also interchangeable with respect to attachment to rigid vertical component 3a and 3aa, 3b, 3bb or 3 whenever rigid vertical components 3 are the same longitudinal vertical height 10b. However, vertical height, width and thickness of stamped metal strips 36 in other embodiments may differ. Referring to FIG. 5C, each stamped pair 37a is parallel to and aligned with its opposing stamped pair 37b along its opposing rigid vertical component 3a, 3aa or 3b, 3bb within an assembled first anterior or first posterior modular rigid support structures 2a, 2b. Stamped metal strips 36a, 36b are also parallel to longitudinal length 10b of corresponding rigid vertical component 3a, 3aa or 3b, 3bb to which stamped metal strip 36a, 36b attaches.

Each first stamped metal strip 36a is preferably approximately three inches anterior to second stamped metal strip 36b. Each stamped metal strip 36a, 36b is preferably identical in structure, design and function to the other. However, stamped metal strip vertical dimensions may vary in other embodiments. In the preferred embodiment, each stamped metal strip 36a, 36b within first anterior modular rigid support structure 2a is approximately fifty-two inches in vertical longitudinal height 10b and approximately one inch in horizontal width. Each stamped metal strip 36a, 36b within first posterior modular rigid support structure 2b is preferably approximately thirty-nine inches in vertical longitudinal height and approximately one inch in horizontal width. Other vertical longitudinal lengths 10b of appropriate U size are satisfactory within additional embodiments.

Referring now to FIGS. 1 and 5C, within each first and second stamped metal strip 36a, 36b respectively are rack sets 7. Each rack set 7 comprises three linearly and vertically aligned rack apertures 8 proximal to corresponding first and second exterior stamped edge 36aa or 36bb respectively. Each rack aperture 8 is square and each of rack aperture's four sides is approximately three-eighths inch in length.

In the preferred embodiment there are twenty-six aligned rack sets 7 within each stamped rack metal strip 36a, 36b of anterior rigid vertical components 3a, and 3aa. Also in the preferred embodiment, there are twenty-one aligned rack sets 7 within each stamped rack metal strip 36a, 36b of posterior rigid vertical components 3b, and 3bb. Each aligned rack set 7 is preferably approximately one and three-quarters inches in vertical height, for consistency with the international standard U vertical unit which is exactly one and three-quarters height. However, other numbers of racks sets 7 are also within the scope of the invention. Each centrally positioned rack aperture 8 is preferably approximately five-eighths inch from adjacent rack apertures 8 within its respective rack set 7. There is preferably approximately one-eighth inch vertically between consecutive rack sets 7.

e. Mounted Device 78 Attachment Structures

Mounted devices 78 mounted and stored upon second modular mount rack frame 1 are generally, but not exclusively, computer-related and include, although not exclusively: servers, hubs, switches and routers. Similarly to modular rigid support structures 2, mounted devices 78 are categorized within internationally designated U units. Mounted device 78 of one U unit is approximately (i) nineteen inches in anterior length and (ii) one and three-quarter inches in vertical height, although depth may vary. Because the international standard height U is 1 and ¾ inches, most manufacturers design their devices 78 and attaching brackets 75 accordingly. Each one U device 78 is approximately 1 and 11/16 inches in height. Consequently, when devices 78 are mounted upon a modular rigid support structure(s) 2, there is approximately 1/32 inch of vertical space between vertically aligned adjacent devices 78 within a modular rigid support structure 2.

Figure 6:
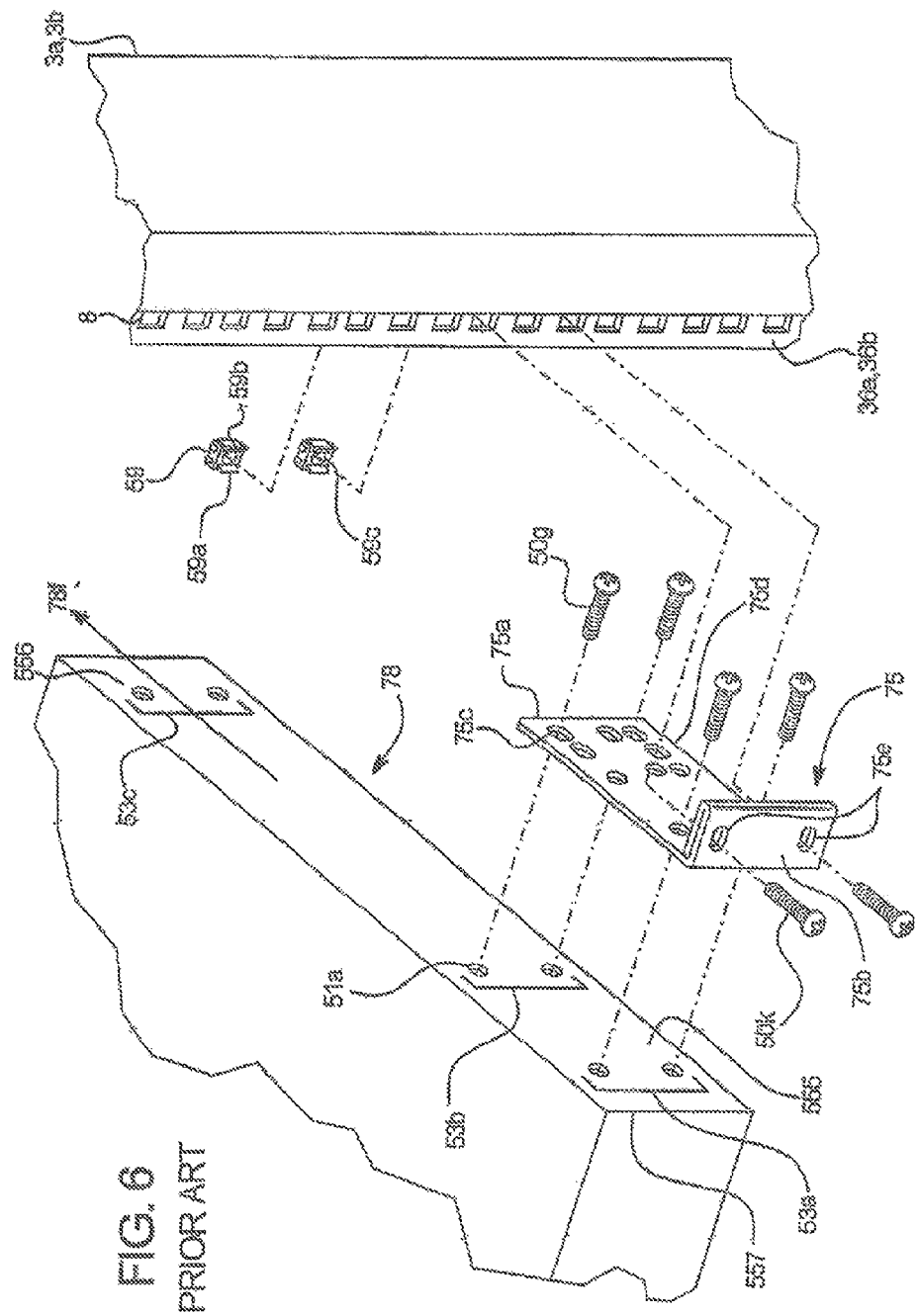
FIG. 6 is a close up isolated view of a prior art connecting bracket attaching to rack apertures and a mounted device.

As best seen in FIGS. 2 and 4, smaller lighter computer-related mounted devices 78i only require two anterior mechanical attachments to stamped metal strips 36a, 36b of two opposing rigid vertical components 3a, 3aa or 3b, 3bb. Opposing two anterior mechanical attachments are sufficient to support the weight of a hub, switch or router 78i. Referring to FIG. 6, larger computer related devices 78t such as servers require: (i) two opposing points along each anterior device segment 555 of each opposing device side 78a, 78b respectively; and (ii) two opposing points along each first and second posterior segment portion 556 of each opposing device side 78a, 78b respectively.

In another embodiment, computer related devices 78i mount to a sole and only rigid modular support structure 2 within second modular mount rack frame 1. This embodiment requires that one modular rigid support structure 2a, 2b, or other modular rigid support structure 2, attach solely and exclusively to first and second rack base legs 7a, 71b. Also in this embodiment, there can only be two anterior attachments at anterior opposing segments 555 of a smaller computer related device 78i.

Referring to FIG. 6, prior art mounting bracket 75 reversibly attaches to mounted device 78i by countersink or bevel head screws 50g. Screws 50g are preferred because they fit flush along a bracket surface. However, other prior art mounting brackets 75, screws and mechanical attachments are satisfactory in other embodiments. Both anterior device side segments 555 of opposing device sides 78a, 78b extend posterior from anterior device edge 557 in an anterior-posterior dimension 78f. First, second and third mounting aperture pairs 53a, 53b, 53c (generically mounting aperture pairs 53) each comprise vertically aligned mounting round apertures 51a. Each mounting aperture pair 53 linearly aligns with remaining pairs 53 along each opposing first and second device sides 78a, 78b (not seen in this view) in anterior/posterior direction 78f. Each mounting aperture pair 53 aligns parallel to posterior device edge 557. Each mounting aperture pair 53 reversibly receives one countersink or bevel head screw 50g within each mounting pair's corresponding mounting round aperture 51a.

There is approximately one to five inches between anterior mounting aperture pairs 53a, 53b and one to five inches between mounting aperture pairs 53b and 53c. Mounting pair 53a is approximately one to five inches from anterior edge 557, while mounting aperture pair 53c is approximately one to five inches from posterior device edge. Still referring to FIG. 6, in the preferred embodiment each prior art mounting bracket 75 preferably comprises flat bracket end 75a, bracket flat segment 75d, and bent bracket end 75b. Flat bracket segment 75d comprises flat end apertures 75c, and each flat end aperture 75c can congruently align with a corresponding mounting round aperture 51a. Bent bracket end 75b is integrally part of, but perpendicular to bracket flat segment 75d. Bent bracket end 75b comprises bent bracket apertures 75e, through which preferably large round Phillips head or straight head screw 50k insert.

Prior art cage nut 59 comprises first and second opposing crimped flanges 59a, 59b, a square configuration and centrally positioned threaded round cage aperture 59c. Cage nut 59 is approximately ⅜ inch in length upon on each side. Cage nut 59 inserts within a single rack aperture 8 and is held therein by opposing protruding first and second cage flanges 59a, 59b respectively. One round threaded screw 50b inserts within each threaded round cage aperture 59c and congruently aligned bent rack apertures 75e, thereby connecting attaching stamped metal strip 36a or 36b to bent bracket end 75b.

To attach mounted device 75i at two anterior points to mounting bracket 75, one counter-sink or beveled head small round screw 50g inserts through
(i) each of two mounting round apertures 51a of a pre-selected mounting aperture pair 53a or 53b to congruently align with;
(ii) each of one of two flat end apertures 75c;
(iii) for a total of two counter sink or beveled round head screws 50g attaching mounted device 78 to mounting bracket 75 (mounting bracket 75 in turn being connected to stamped metal strip 36a, 36b by bent bracket end 75b, screws 50k and cage nuts 59). FIGS. 4 and 6.

For the above described two-point attachment, one anterior aperture pair 53a or 53b is selected, with that aperture pair 53a, 53b being the same opposing aperture pair on each opposing device side 78a, 78b. With four-point attachment, opposing anterior two point attachment is identical, with addition to two point attachments at aperture pair 53c. For posterior attachment at posterior aperture pairs 53c, brackets 75 and cage nuts 59 attach to device 78 and stamped metal strip 36a, 36b in a manner identical to two-point attachment of anterior aperture pairs 53a or 53b. Please see FIGS. 2 and 6.

f. Power Strip 600

Referring to FIG. 3 of the preferred embodiment, prior art electrical power strip 600 facilitates operation of mounted device 78 (not seen in this view) without removal of devices 78 from second modular mount rack frame 1. Power strip 600 reversibly attaches to one rigid vertical component 3 with small round screws 50a. Power strip 600 is preferably approximately nineteen inches in longitudinal length, one and three-quarters inches in width, and one and three-eight inch in depth. Power strip 600 preferably attaches to first or second lateral vertical component side 40d,40dd respectively by screws 50a and four round penetrating apertures 601a, 601b, 601c, 601d within each rigid vertical component 3. Small round penetrating apertures 601 are linearly and vertically aligned along longitudinal midline 602 of lateral vertical component side 40*d* or 40*dd*.

Within fully assembled preferred second modular mount rack frame 1, uppermost round penetrating aperture 601*a* is preferably approximately 47 inches from flat supporting surface 480. Second lower round penetrating aperture 601*b* is approximately 28.5 inches from supporting surface 480. Third lower round penetrating aperture 601*c* is approximately 24 inches from surface 480, while fourth lowest round penetrating aperture 601*d* is approximately six inches from supporting surface 480. Vertical distance of power strip 600 from flat supporting surface 480 along a corresponding vertical rigid component 3 is adjustable by inserting small round screws 50*a* into upper or lower small round penetrating apertures 601*a*, 601*b*, 601*c*, 601*d*.

As seen in FIG. 3, power strip 600 is parallel to, immediately contacts and adjoins rigid vertical component 3*aa* to which it mechanically attaches. Other positions and locations of electrical power strip 600 are also within the scope of the invention. For example, power strip end 600*a* can attach to a rigid vertical component 3 at right angles to longitudinal vertical length 10*b*. In other embodiments power strip ends 600*a*, 600*b* attach to first and second opposing stamped metal strips 36*a*, 36*a*, in this last embodiment power strip 600 is parallel to assembled rigid horizontal components 4*a* (not seen in this view) and 4*aa*.

g. Straight Rack Base Legs 471*a*, 471*b*

Referring to FIGS. 1, 2, 3 and 5B of the preferred embodiment of second modular mount rack frame 1 preferably comprises a first straight base leg 471*a* and a second straight base leg 471*b*. Each straight base leg 471*a*, 471*b* is approximately (i) thirty inches in maximum longitudinal length along straight leg bottom edge 471; and (ii) two and three-quarters inches in straight leg width. However, the longitudinal length of each straight rack base leg 471*a*, 271*b* may range between approximately thirty and thirty-three inches and remain satisfactory for its free standing and load bearing utilities. Each straight base leg 471*a*, 471*b* is made of flat metal which is approximately one-sixteenth inch in thickness.

Figure 5B:
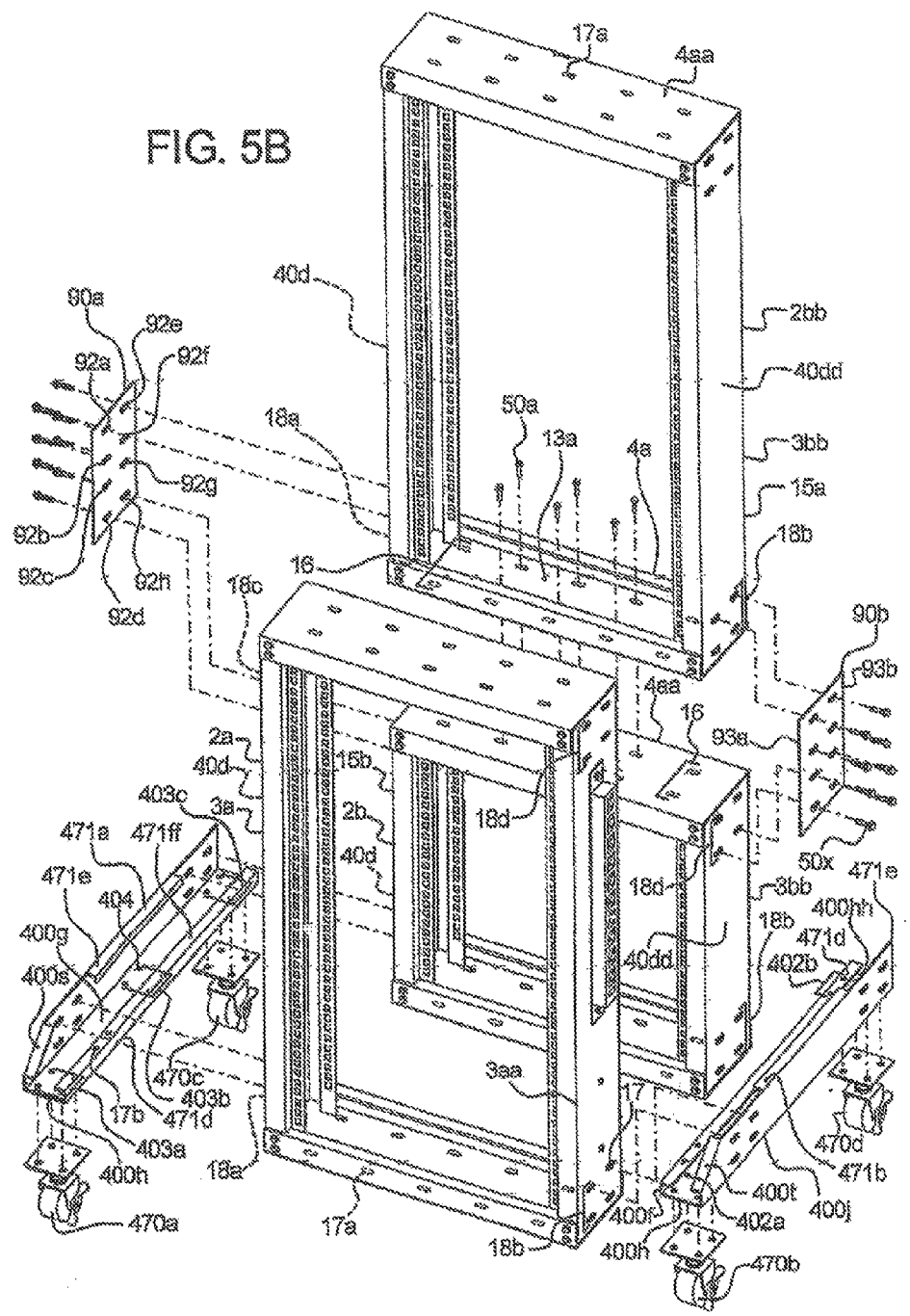
FIG. 5B is an exploded view of the second mount rack frame with an additional vertically aligned modular rigid support structure.

Referring to FIGS. 1 and 2 of the preferred embodiment of the second mount rack frame 1 each first straight base leg 471*a* preferably directly opposes second straight base leg 471*b* at a one hundred and eighty-degree angle. First straight base leg 471*a* lies in the same plane as second straight base leg 471*b* when assembled within second modular mount rack frame 1. First straight base leg 471*a* is also the same vertical distance above flat horizontal supporting surface 480 as is second straight base leg 471*b* when assembled as second modular mount rack frame 1. Each straight base leg 471*a*, 471*b* is parallel to the other in an anterior/posterior direction. Each straight base leg 471*a*, 471*b* aligns perpendicular to corresponding attached rigid vertical component 3, and each straight base leg 471*a*, 471*b* is structurally and functionally identical to the other. As best seen in FIG. 5B, each straight base leg 471*a*, 471*b* has an inner leg edge 471*d* and an outer leg edge 471*e*. Each inner leg edge 471*d* comprises inner longitudinal leg ledge 400*f* with protruding ledge inner lip 471*ff*.

Referring to FIG. 5B, inner longitudinal leg ledge 400*f* is approximately three-quarters inch in height and perpendicular to lower base leg side 400*g*. Protruding ledge inner lip 471*ff* is approximately three-quarters inch in width and perpendicular to inner longitudinal leg ledge 400*f*. These features are identical to those of the preferred embodiment of FIG. 1. Protruding ledge inner lip 471*ff* and inner longitudinal leg ledge 400*f* is integrally part of and coextensive with straight base leg 471*a* or 471*b*.

Each protruding ledge inner lip 471*ff* comprises a first leg threaded aperture pair 402*a* and a second leg threaded aperture pair 402*b*. First leg threaded aperture pair 402*a* is positioned at anterior straight base leg end 400*h*, while second leg threaded aperture pair 402*b* is positioned at posterior straight base end 400*hh*. Leg threaded aperture pairs 402*a*, 402*b* each comprise two smaller rounded threaded apertures 17*b*. Smaller round threaded apertures 17*b* reversibly receive threaded round screws 50*a* which attach straight base legs 471*a*, 471*b* to smaller partially elliptical apertures 17*a* (not seen in this view) of horizontal aperture pair 16*a* or 16*e*. These features are identical to those attachment features of the preferred embodiment in FIG. 1.

As best seen in FIG. 3 and FIG. 5B, outer leg edge 471*e* comprises upper outer leg wall 400*j*. Upper outer leg wall 400*j* is approximately four inches in height, and wall 400*j* protrudes upwardly and perpendicular to straight leg lowest side 400*g*. Upper outer leg wall 400*j* comprises two first and second wall aperture sets 400*k*, 400*kk*, and each wall aperture set 400*k*, 400*kk* containing four large partially elliptical apertures 17. Wall sets 400*k*, 400*kk* respectively each form a square at first and second straight base leg ends 400*h*, 400*hh* respectively for a total of eight large partially elliptical apertures 17. Referring to FIGS. 2 and 3 of the preferred embodiment, upper outer leg wall 400*j* is coextensive and integral with straight base leg 471*a* or 471*b*. Upper leg wall 400*j* contains upper leg wall ledge 400*jj*, and ledge 400*jj* protrudes in a perpendicular and interior direction to upper leg wall 400*j*. Each upper leg wall ledge 400*jj* is approximately three-quarters inch in width and comprises downward protruding interior side 400*q* as seen in FIG. 1. Downward protruding interior side 400*q* is approximately three-eighths inch in width.

Referring to FIG. 5B, each straight base leg lowest side 400*g* comprises first, second and third track sets 403*a*, 403*b*, and 403*c* respectively of small round track apertures 404 (generically track sets 403). Each track set 403 forms a square configuration of four small round track apertures 404. Each small round track aperture 404 is adapted to receive a small diameter round head screw 50*a* for attachment of a coaster or wheel 470*a*, 470*b* to straight leg lower track 400*g*. Each small round track aperture 404 is approximately one-quarter inch in diameter. First track set 403*a* is aligned with remaining tracks sets 403*b*, 403*c*, and set 403*a* lies within straight base leg lowest side 400*g* at straight leg slanted anterior end 400*h*. Second track set 403*b* lies within straight base leg lowest side 400*g* at the longitudinal midpoint of each straight base leg 471*a*, 471*b*, and third track set 404*c* is located at straight leg posterior end 400*hh*. Implementation of six castors or wheels 470 with a straight rack base leg of between approximately thirty inches and thirty-three inches in longitudinal length will support a maximum load of 1,320 pounds.

Referring to FIGS. 1, 3 and 5B, each first straight leg anterior end 400*h* of straight base legs 471*a*, 471*b* respectively comprise a first or second slanted lip 400*s*, 400*t* respectively. Each first or second slanted lip 400*s*, 400*t* respectively integrally attaches to corresponding first and second slanted outer edge 471*e*, 471*ee* respectively. Each slanted lip 400*s*, 400*t* comprises a trapezoidal shape which is: one inch in length on each lateral trapezoidal side, three inches in length on its upper trapezoidal side, and four inches on its lower trapezoidal side. Each slanted lip 400*s*, 400*t* protrudes downward and interiorly from slanted outer edges 471*e*, 471*ee* at an angle of approximately 70 degrees.

Each first and second vertical rigid component 3a, 3aa respectively, of first anterior rigid support structure 2a, attaches approximately three inches from corresponding straight leg anterior end 400h of first straight base leg 471a and second straight leg anterior end 400h of second straight base leg 471b respectively. Each first and second vertical rigid component 3b, 3bb respectively, of second rigid modular support structure 2b, is flush with corresponding posterior base leg end 400hh of first straight base leg 471a or corresponding posterior base leg end 400hh of second straight base leg 471b.

Referring to FIGS. 1, 2 and 3, along lowest leg surface 400p of each straight base leg 471a, 471b are prior art first, second, third and fourth coasters or wheels 470a, 470b, 470c, 470d [generally coasters or wheels 470]. Coasters or wheels 470 mechanically attach to lowest leg surface 400p in a conventional manner at anterior straight base leg ends 400h and posterior straight base leg ends 400hh. With coasters or wheels 470, second modular mount rack frame 1 rolls easily along a flat horizontal supporting surface 480 such as a floor. Prior art locks 479 prevent second modular mount rack frame 1 from inadvertent movement. Round screws 50b with washers are preferred for wheel or coaster attachments 481 to straight track aperture track sets 403.

h. Vertically Aligned Modular Multi-Component Rigid Support Structures 2

Referring to FIG. 5B another embodiment of second mount rack frame 1 comprises first anterior modular rigid support structure 2a, first posterior multi-component modular rigid support structure 2b and uppermost second posterior modular rigid support structure 2bb. First and second posterior modular rigid support structures 2b, 2bb respectively are vertically attached and aligned to each other, so lower first modular rigid structure 2b supports upper second modular rigid support structure 2bb upon straight rack base legs 471a, 471b. Mounted devices 78 vertically align and attach to rigid vertical components 3a, 3aa as described supra for the preferred embodiment of second mount rack frame 1.

Because of modular design, in other embodiments second posterior modular rigid support structure 2bb can also function as, but not exclusively (i) first anterior modular support structure 2a; (ii) second anterior modular rigid support structure 2aa; (iii) first posterior modular rigid support structure 2b; or (iii) other modular rigid support structure 2. In this embodiment, second posterior modular rigid support structure 2bb provides an upper modular unit which increases storage capacity without additional floor space. Still referring to FIG. 5B, in this embodiment first anterior modular rigid support structure 2a is approximately fifty-three inches in height; first posterior modular rigid support structure 2b is approximately thirty-nine inches in height; and second posterior modular rigid support structure 2bb is approximately seventeen and one-half inches in height. In other embodiments longitudinal vertical heights 10b of vertical rigid components 3 may vary as does depth of modular rigid support structures 2.

In other embodiments second mount rack frame 1 comprises vertically aligned first anterior modular rigid support structure 2a, second anterior modular rigid support structure 2aa, and first posterior modular rigid support structure 2b. In another permutation of a vertically modified second mount rack frame 1 (i) first anterior modular rigid support structure 2a attaches upper second anterior modular rigid support structure 2aa, while (ii) first posterior modular rigid support structure 2b attaches vertically aligned upper second posterior modular rigid support structure 2bb. Attached modular rigid support structures 2aa, 2bb can be of diverse vertical heights but the effective lateral horizontal dimension 10aa of rigid horizontal components 4 is always nineteen inches. Each modular rigid support structure 2aa, 2bb is identical in structure and design to modular rigid support structures 2a, 2b, as well as other modular rigid support structures 2.

Second Embodiment of Second Modular Mount Rack Frame 1

Referring to FIGS. 4, 5A and 7, the second embodiment of second modular mount frame 1 comprises (i) sole and only first anterior modular rigid support structure 2a; or (ii) sole and only first one posterior modular rigid support structure 2b; or another sole and only modular rigid support structure 2. In other embodiments there is vertical stacking of an uppermost additional modular rigid support structure 2aa, 2bb or 2 upon sole and single supporting modular rigid support structure 2.

Still referring to FIGS. 4 and 5A, removable first and second rack base legs 71a, 71b respectively substitute for straight base legs 471a, 471b of the preferred embodiment and other embodiments of second mount rack frame 1. Each first and second rack base leg 71a, 71b respectively preferably comprises first, second, third and fourth rack coasters or wheels 70a, 70b, 70c; 70d (generically rack coasters or wheels 70). Preferably prior art first and second rack coasters or wheels 70 attach to anterior and posterior rack base leg ends 71aa, 71bb, 71cc, 71dd respectively in a manner well known in the art. Each rack coaster or wheel 70 comprises a corresponding prior art lock 79. Prior art locks 79 prevent second modular mount rack frame 1 from inadvertent swiveling along flat supporting surface 480. Each prior art wheel attachment 51b comprises small round apertures 51bb so each attachment 51b mechanically connects to first track set 403a by small round screws 50b.

Still referring to FIGS. 4 and 5A, one rack leg square set 900 penetrates each exterior upper slanted leg side 73d of each corresponding rack base leg 71a, 71b below each rack base leg maximum height 777. Each rack leg square set 900 comprises four rack large partially elliptical apertures 81a, 81b, 81c, 81d (generally rack large partially elliptical apertures 81] positioned within square configuration. Each rack large partially elliptical aperture 81 is identical in dimension and shape to large partially elliptical aperture 17. Each rack large partially elliptical aperture 81 respective longitudinal length 10e is parallel to the corresponding longitudinal length of rack base legs 71a, 71b. Threaded bolts 50x attach respective rack base legs 71a, 71b to each congruently aligned vertical square set 18 through congruently aligned rack leg square sets 900. Other mechanical fasteners are satisfactory in alternative embodiments.

Each first and second rack base leg 71a, 71b respectively comprises interior flat lowest side 73c, exterior upper slanted side 73d, and rack base leg interior side 70e. Each rack base leg 71a, 71b is preferably approximately twenty inches in length in an anterior/posterior direction, and two and three-quarters inches in width. Each rack base leg 71a, 71b is approximately two and one-half inches in height where upwardly slanted side 73d attaches to each corresponding vertical component end 15a or 15b. Each exterior upper slanted side 73d is preferably approximately one and one-half inches in height at anterior leg end 71aa, 71bb and posterior leg end 71cc, 71dd.

Still referring to FIGS. 4 and 5A, flat interior lower side 73c is uniformly approximately three-quarters inch in height and comprises protruding ledge 73t. Protruding ledge 73t is perpendicular to flat lower side 73c and is approximately three-quarters inches in width. Protruding ledge 73t contains anterior and posterior threaded round apertures 778a, 778b respectively. Anterior and posterior threaded round apertures 778a, 778b are approximately two and one-quarter inches apart. Anterior threaded round aperture 778a is approximately six and one-quarter inch from anterior rack base leg end 71aa or 71bb. Threaded round apertures 778a, 778b congruently align with aperture pairs 16a, 16e for insertion of round screws 50a.

Each rack base leg 71a, 71b aligns perpendicular to corresponding attached modular rigid support structure 2a, 2b or 2. Preferably each rack base leg 71a, 71b is structurally and functionally identical to the other, except that one leg 71a is oriented for use as a left leg and one leg 71b is oriented for use as a right leg. Each rack base leg 71a, 71b preferably consists of a single metal sheet which is approximately one-sixteenth inch in thickness. Each single metal sheet bends at a right angle to form lower rack base side 70e, as well as exterior and interior sides 73c, 73d. Rack base legs 71a, 71b are preferred in embodiments in which there is only (i) a single first modular rigid support structure 2a, 2b, 2 or (ii) a single first modular rigid support structure 2a, 2b, 2 with a vertically aligned and vertically attaching second modular rigid support structure 2a, 2b or 2. In this embodiment preferably each first and second rack base leg 71a, 71b respectively attaches to corresponding vertical rigid component end 15a approximately three inches posterior to corresponding anterior rack base leg end 71aa.

i. Rigid Flat Connecting Plates 90

Still referring to FIG. 5B, second mount rack frame 1 preferably comprises at least one first rigid flat connecting plate 90a and at least one second rigid flat connecting plate 90b for additional mechanical stability and rigidity [generically rigid flat connecting plates 90]. Each rigid flat connecting plate 90 is preferably structurally and functionally identical to the other with the same length, width and thickness. Preferably rigid flat connecting plates 90 are rectangular, but other shapes and dimensions are satisfactory in other embodiments.

Preferably each rigid flat connecting plate 90 is approximately six inches in length, four and five-eighths inches in width and one-sixteenth inch in thickness. Each rigid flat connecting plate 90 preferably comprises large partially elliptical plate apertures 92a, 92b, 92c, 92d, 92e, 92f, 92g and 92h (generically plate apertures 92). Plate apertures 92 form two linearly aligned sets of four apertures 92 at each adjacent first and second opposing plate edges 93a, 93b respectively: 92a, 92b, 92c, 92d respectively; and 92e, 92f, 92g, 92h respectively. However, other numbers and positions of plate apertures 92 are also satisfactory. Preferably each plate aperture 92, as measured from each plate aperture center 92j, lies approximately five-eighths inch from the first or second corresponding longitudinal opposing plate edge 93a or 93b. Interior positioned plate apertures 92b, 92c are one and one-quarter inch apart from each other, as are interiorly positioned plate apertures 92f, 92g. Distal positioned plate apertures 92a, 92d and 92e, 92h are one and three-quarters inches from each other. Each plate aperture 92 is preferably identical to large partially elliptical aperture 17 in dimensions and shape.

Still referring to FIG. 5B, plate apertures 92 congruently align with corresponding horizontally aligned large partially elliptical apertures 17 within two square sets 18 of a lateral vertical component side 40d or 40dd. Congruently aligned large partially elliptical apertures 17 and plate apertures 92 thereby mechanically attach two adjoining rigid vertical components 3a, 3aa, 3b, 3bb, or other components 3 with bolts 50x, to form a stable continuous vertical structure. Also as seen in FIG. 5B, horizontal aperture pairs 16 within upper positioned rigid horizontal component 4aa to congruently align with their spatial counterparts within lower rigid horizontal component 4a. One screw 50a inserts though each of congruently aligned horizontal aperture pairs 16a, 16b, 16c, 16d, and 16e within both rigid horizontal components 4a, 4aa to mechanically attach two vertically aligned modular rigid support structures 2 to each other. Each flat connecting plate 90 structurally attaches to interchangeably attaching vertically aligned rigid vertical component ends 15a,15b of rigid vertical components 3a, 3b as described supra for embodiments of second mount rack frame 1.

Referring to FIG. 7, a fourth embodiment of second mount rack frame 1 comprises first anterior modular rigid support structure 2a and upper vertically positioned second anterior modular rigid support structure 2aa. Attachment of flat rigid connecting plates 90a, 90b is identical in third and fourth embodiments, as well as in other embodiments. Attachment by congruently aligned horizontal aperture pairs 16 and screws 50 of connecting plates 90a 90b is identical to that described supra for other embodiments of the second modular mount rack frame.

Best Mode and Preferred Assembly of One Modular Rigid Multi-Component Support Structure 2 for Second Modular Mount Rack Frame 1

In the best mode, the assembly of modular rigid support structures 2a, 2aa, 2b and 2bb is identical for other modular rigid support structures 2. For illustration purposes the following example primarily describes assembly of first anterior modular rigid support structure 2a. Referring to FIG. 5C, the operator initially selects a first rigid vertical component 3a and a first rigid horizontal component 4a. He or she next inserts one vertical component end 15a of first rigid vertical component 3a within corresponding cut-out segment 19c of first rigid horizontal component 4a. He or she then inserts one threaded bolt 50x through each of two congruently aligned horizontal large partially elliptical apertures 17 within each aperture pair 14aa/14a and 14b/14bb. This procedure results in the attachment of one rigid vertical component end 15a to one rigid horizontal component end 19a at location A.

The operator next inserts one end 15a of second rigid vertical component 3aa within corresponding cutout 19c of second horizontal component end 19b of first rigid horizontal component 4a. He or she congruently aligns each of two large partially elliptical apertures 17 of aperture pairs 14a/14aa and 14b/14bb in an identical manner to that described immediately supra. The operator inserts and tightens one threaded bolt 50x through each two congruently aligned large partially elliptical apertures 17 of horizontal and vertical aperture pair's 14a/14aa and 14b/14bb. This procedure attaches one vertical component end 15a to one horizontal component end 19b at location B.

The operator next inserts second vertical component end 15b within corresponding cutout segment 19c at rigid horizontal end 19b of second rigid horizontal component 4aa. He or she congruently aligns aperture pairs 14c/14cc and 14d/14dd as described previously for aperture pairs 14a/14aa and 14b/14bb. Threaded bolts 50x insert through aligned aperture pairs 14c/14cc, 14d/14dd to attach rigid vertical component 3aa to second rigid horizontal component 4aa at location C.

At location D, vertical aperture pairs 14cc, 14dd at vertical end 15b of rigid vertical component 3a congruently align with horizontal aperture pairs 14c, 14d respectively at horizontal end 19a of second rigid horizontal component 4aa. Threaded bolts 50x insert through aligned pairs 14c/

14cc and 14d/14dd as previously described. Preferably all rigid vertical component ends 15a, 15b are identical to each other, and all rigid horizontal component ends 19a, 19b are identical to each other. In other modes rigid horizontal components 4a, 4aa and rigid vertical components 3a, 3aa interchangeably and reversibly assemble in a different chronological order.

Still referring to FIG. 5C, after assembly of one modular rigid support structure 2a, there are a total of sixteen large partially elliptical apertures 17: (i) eight large partially elliptical apertures 17 in an anterior orientation; and (ii) eight partially elliptical apertures 17 in a posterior orientation. In other embodiments rigid vertical components 3 and rigid horizontal components 4 assemble into other four-sided polygons, or other shapes, to form modular rigid support structure 2.

Assembly of the Preferred Embodiment of Second Mount Rack Frame 1 a. Best Mode of Attaching Modular Rigid Support Structures 2a, 2b to First and Second Straight Base Legs 471a, 471b Referring to FIGS. 3 and 5B, the operator initially selects one straight base leg 471a or 471b for attachment to rigid vertical component 3a or 3aa of completely assembled first anterior modular rigid support structures 2a. He or she congruently initially aligns (i) square aperture set 18b with (ii) corresponding square aperture set 400k within corresponding straight leg upwardly protruding wall 400j.

The operator inserts and tightens single threaded bolt 50x through each pair of congruently aligned large partially elliptical apertures 17 within (i) corresponding straight leg upwardly protruding wall 400j and (ii) square aperture set 18b within vertical lateral component side 40dd.

The operator follows the same procedure for attachment of rigid vertical component 3aa, 3b, 3bb or other rigid vertical component 3 to straight base leg 471a, 471b. This procedure includes insertion of bolts 50x through remaining three straight leg exterior square sets 400k and corresponding congruently aligned partial elliptical apertures 17 of remaining three aperture square sets 18.

After complete assembly of the preferred second modular mount rack frame 1, each straight base leg 471a, 471b is (i) parallel to the other. Each straight base leg 471a, 471b is also perpendicular to corresponding attached rigid vertical components 3. However, other attachment chronologies and procedures also exist within the scope of the invention.

(2) Attachment of Rigid Horizontal Components 4 to Straight Base Legs 471a, 471b As best seen in FIG. 5B, each horizontal component end 19a, 19b attaches to a corresponding inner longitudinal leg ledge 400f. The operator congruently aligns (i) smaller partially elliptical apertures 17a within an outermost horizontal pair 16a, 16e within rigid horizontal component 4a, 4a, 4b, 4bb, or 4; with (ii) two threaded round apertures 17b within one corresponding inner longitudinal leg ledge 400ff.

The operator then inserts and tightens large one round threaded screw 50a through each congruently aligned smaller partially elliptical aperture 17a within horizontal pair 16a or 16e, and corresponding threaded round aperture 17b. The operator repeats this procedure for remaining congruently aligned outermost horizontal aperture pairs 16 and threaded round apertures 17b of inner longitudinal leg ledge 400f.

Each anterior surface 10d of rigid vertical component end 15a is positioned three inches from corresponding anterior straight base leg end 400h when corresponding anterior rigid vertical component 3a, 3aa is properly attached to straight base leg 471a, 471b. Each posterior vertical surface 10dd of rigid vertical component end 15a of posterior rigid vertical component 3b, 3bb is flush with corresponding posterior straight base leg end 400hh.

Best Mode Attachment of Modular Rigid Support Structure 2 to Rack Base Legs 71a, 71b in the Second Embodiment of Second Modular Mount Rack Frame 1

Referring to FIG. 5A, each first and second rigid vertical component 3a, 3aa, 3b, 3bb, or 3 respectively attaches approximately six inches posterior to each corresponding first and second anterior rack base leg end 71aa, 71bb respectively. First, second, third and fourth partially large elliptical leg apertures 81a, 81b, 81c, 81d (generically rack large partially elliptical leg apertures 81) within each upwardly slanting rack leg wall 73d, respectively congruently align with square aperture pairs 18 of a corresponding vertical component end 15a.

Each two congruently aligned apertures 81/18 mechanically connects to each other by insertion of single threaded bolt 50x. In embodiments comprising a single modular rigid support structure 2 with rack base legs 71a, 71b, these bolts 50x provide attachment of rigid vertical components 3 to rack base legs 71a, 71b.

Horizontal rigid components 4 attach to rack base legs 71a, 71b, by horizontal aperture pairs 16a or 16e and corresponding ledge apertures 778a, 778b. Apertures 778a, 778b congruently align with small partially elliptical apertures 17a with aperture pair 16a or 16e. The operator then inserts and tightens one large screw 50a through apertures 778a/16a, 778b/16a, or 778a/16e, 778b/16e.

Referring to FIGS. 2, 3 and 5B, prior art coasters or wheels 470 attach to lowest straight leg surface 400p at each anterior straight base leg end 400h or posterior base leg end 400hh. Prior art coasters or wheels 470 attach with well-known prior art devices 481 by four small round screws 50g to lowest straight leg surface 400p in a pivoting manner. Referring to FIG. 5A, rack coasters 70 attach to each rack base leg 71a, 71b at rack base ends 71 in a pivoting manner. Rack coasters or wheels 70 attach to base legs 71a, 71b by pivoting conventional prior art attachments 51b and mechanical fasteners 50b in a manner similar to that of straight base legs 471a, 471b described supra. However, other chronologies and procedures for frame assembly are also within the scope of the invention.

Best Mode of Assembly of Second Modular Mount Rack Frame 1 for Vertically Aligned and Attaching Uppermost Modular Rigid Support Structure 2b in the Preferred Embodiment and Second Embodiment Referring to FIG. 5B, to attach one uppermost modular rigid support structure 2bb, the operator positions second posterior modular rigid support structure 2bb upon upper first rigid horizontal component 4aa of lower positioned first posterior modular rigid support structure 2b. Horizontal aperture pairs 16 within lower rigid horizontal component 4a of second posterior modular rigid support structure 2bb are now congruent with aperture pairs 16 within upper first rigid horizontal component 4aa of first posterior modular rigid support structure 2b. The operator inserts and tightens one large round threaded screw 50a through each pair of smaller partially elliptical aperture 17a/17a within each congruently aligned horizontal aperture pair 16 of adjoining rigid first and second horizontal components 4a, 4aa.

The operator next congruently aligns plate apertures 92 of flat rigid connector plates 90a with
(i) corresponding vertical aperture sets 18a/18c along
(ii) lateral vertical component sides 40d of rigid vertical components ends 15a, 15b of rigid vertical support components 3bb, 3bb
(iii) of first posterior modular rigid support structure 2b and upper second posterior modular rigid support structure 2bb.

The operator then inserts and tightens bolt 50x through each of the eight pairs of congruently aligned apertures 17/92. The operator repeats this identical procedure with second flat rigid connector plate 90b along rigid vertical component ends 15a, 15b of remaining rigid vertical components 3bb, and 3bb.

This identical procedure as described immediately supra, with rigid horizontal aperture pairs 16 and flat rigid connector plates 90, is also the best mode for upper vertical attachment of first anterior modular rigid support structure 2a to second anterior modular rigid support structure 2aa in another embodiment. Rigid horizontal components 4a, 4aa are preferably identical in structure and dimensions, so horizontal rigid components 4a, 4aa are reversible with respect to upper and lower vertical positions.

With respect to horizontal aperture pairs 16, the same attachment procedure with screws 50a remains the best mode for the preferred embodiment, as illustrated in FIG. 1. Preferably connector plates 90 are included within the best mode for upper vertical attachment of any modular rigid support structure 2 to another modular rigid support structure 2 in other embodiments.

Best Mode of Attaching Mounted Device 78 to the Preferred Embodiment of Second Modular Mount Rack Frame 1 and Other Embodiments a. Anterior Two Opposing Point Attachment (1) Connecting Device 78 to Bracket 75

Referring to FIGS. 4 and 6, the operator congruently aligns mounting bracket 75 to first opposing device aperture pair 53a and 53b. He or she inserts and tightens single screw 50g through each corresponding congruently aligned device aperture 51a and bracket aperture 75c.

(2) connecting bracket 75 to stamped metal strip 36a, 36b

The operator inserts two cage nuts 59 within two vertically adjacent corresponding rack apertures 8 of first or second stamped metal strip 36a, 36b. The operator inserts each cage nut 59, so each first and second cage nut flange 59a, 59b respectively protrudes anterior from each corresponding rack aperture 8.

The operator orients mounting bracket 75 so two bent bracket apertures 75e congruently align with corresponding cage nut apertures 59c within respective rack apertures 8. The operator next inserts and tightens Philips screw 50k through each corresponding congruently aligned rack apertures 8, bent segment aperture 75e, and cage nut aperture 59c. During this step the operator inserts Phillips screw 50k into cage nut aperture 59c through protruding cage nut flanges 59a, 59b.

The operator repeats this identical process on the second opposing device side 78b (not seen in FIG. 6), and thereby attaches second opposing side 78b to corresponding stamped metal strip 36a or 36b. The operator can orient mounting bracket bent end 75b for attachment through rack apertures 8 of posterior stamped metal strip 36b or anterior stamped metal strip 36a. To disengage mounted device 78, the operator removes each Phillips screw 50k from congruently aligned cage nut 59, rack aperture 8 and bent racket aperture 75e.

This prior art attachment as described for rigid vertical component 3a is the best mode for all other modular rigid support structures 2 and devices 78i. Other numbers of prior art bent bracket apertures 75e, with corresponding rack apertures 8 and prior art cage nuts 59, are also within the scope of the invention. In some embodiments mounting options also depend upon the design features of the manufacturer.

b. Four Opposing Point Attachment

Referring to FIGS. 2 and 6, the mechanics of attachment are identical to those for two point opposing point attachment with respect to anterior aperture pairs 53a and/or 53b. However, on each posterior opposing side segment 556, cage nut flanges 59a, 59c protrude posterior where device 78 attaches at opposing posterior device aperture pairs 53c, and so bent bracket end 75b also faces posterior.

Consequently mounted device 78, such as computer server 78t, attaches at
(i) First or second anterior device aperture pairs 53a or 53b respectively along the device's first and second opposing sides 78a, 78b respectively; and
(ii) Posterior device aperture pair 53c along the same device's first and second opposing sides 78a, 78b respectively,
for a total of eight attachment points.

Referring to FIG. 6, in the best mode each device aperture pair 53a, 53b, 53c and corresponding cage nuts 59 are positioned the same vertical distance along corresponding stamped metal strips 36a or 36b from flat supporting surface 480 when supporting single device 78t. In embodiments with at least two opposing modular rigid support structures 2, there is sufficient structure for solely anterior support (two-point attachment) or anterior-posterior support (four-point attachment).

For example, smaller mounted devices 78i can be supported at device anterior segment 555 with two-point attachment by any modular rigid support structure 2, such as modular rigid support structures 2a, 2aa, 2b, 2bb. Similarly, larger mounted devices 78t can be supported at device posterior 556 by any modular rigid support structures 2 for four-point attachment. As seen in FIG. 4, in other embodiments, a sole and single modular rigid support structure 2 provides anterior two-point attachment.

Modification of a Linear Dimension 10a Between Rigid Vertical Components 3 within Each Rigid Multi-Component Support Structure 2, 2a and 2b in the Second Modular Mount Rack Frame in the Preferred Embodiment, Second Embodiment and Other Embodiments In the pending invention there is one U unit of vertical height (i. e., one and three-quarter inches) for each subset 7 of three rack apertures 8. Referring now to FIGS. 8A and 8B, many mounted devices 78 deviate from the U industry standard of nineteen inches of horizontal length 10a. In addition, prior art brackets 75 often exhibit variations in thickness of bent segment 75b and flat segment 75d. These variations may interfere with precise fittings between rack apertures 8 and mounted device opposing sides 78a, 78b.

As seen in FIGS. 8a and 8B, the operator can adjust the effective horizontal length 10a between for example, two opposing rigid vertical components 3a, 3aa, or 3b, 3bb within a single modular rigid support structure 2a, 2b, 2bb. This same procedure is applicable to any other pair of opposing rigid vertical components 3 within single modular rigid support structure 2.

To adjust effective horizontal length 10a, the operator initially loosens each bolt 50x and connected hex nut (not seen) within congruently aligned vertical aperture pairs 14 and 14*h* within a single or two opposing rigid vertical components 3*a*, 3*aa*, 3*b*, 3*bb* or 3. The operator loosens Phillips screw 50*a* from each exterior positioned horizontal aperture pair 16*a* or 16*e* which congruently aligns with round threaded apertures 402*a*, 402*b* within corresponding attached straight base leg interior ledges 471*ff*.

Referring to FIG. 8A, preferably there is longitudinal clearance of approximately one-sixteenth inch on each side of each originally inserted bolt 50*x* or screw 50*a*. This clearance limits the distance each bolt 50*x* or large round screw 50*a* may move laterally to increase effective distance 10*a*. The operator loosens bolts 50*x* and mated hex nuts inserted within each pair of (i) partially elliptical apertures 17 of aperture set 400*k* or 400*kk*; and (ii) partially elliptical apertures 17 of corresponding square aperture sets 18. As best seen in FIG. 8B, the operator manually moves each rigid vertical component 3*a*/3*aa*, 3*b*/3*bb*, or 3/3 (depending upon the embodiment) laterally in an exterior direction within corresponding cutout segment(s) 19*c*. This lateral movement continues until each bolt 50*x* or large round screw 50*a* abuts outermost edge 14*g* of corresponding partially elliptical aperture 17 or 17*a*. The operator then tightens bolts 50*x* within lateral vertical aperture sets 18 and square aperture sets 400*k* and/or 400*kk*, as well as partially elliptical aperture pairs 14, 14*h* and 16.

To decrease effective horizontal length 10*a* the operator manually moves each rigid vertical component 3*a*, 3*aa* or 3*b*, 3*bb* (or both depending upon the embodiment) laterally inward within each cutout segment section 19*c*, and until each bolt 50*x* abuts innermost partially elliptical aperture edge 14*f* of corresponding partially elliptical apertures 17, 17*a*. For both inward and outward lateral adjustments, after positioning rigid vertical components such as 3*a*, 3*aa*, the operator tightens bolts 50*x*, hex nuts and Phillips screws 50*a*.

The same procedure for lateral adjustment applies to embodiments which (i) comprise vertically positioned rigid modular support structures such as 2*aa* or 2*bb*. In these embodiments vertically aligned modular rigid support structures 2 can be laterally adjusted together, or independently of one another. The same procedure for lateral adjustment also applies to embodiments of second modular mount rack frame 1 with sole and single rigid modular support structure 2.

Third Mount Rack Frame 608

Figure 9:
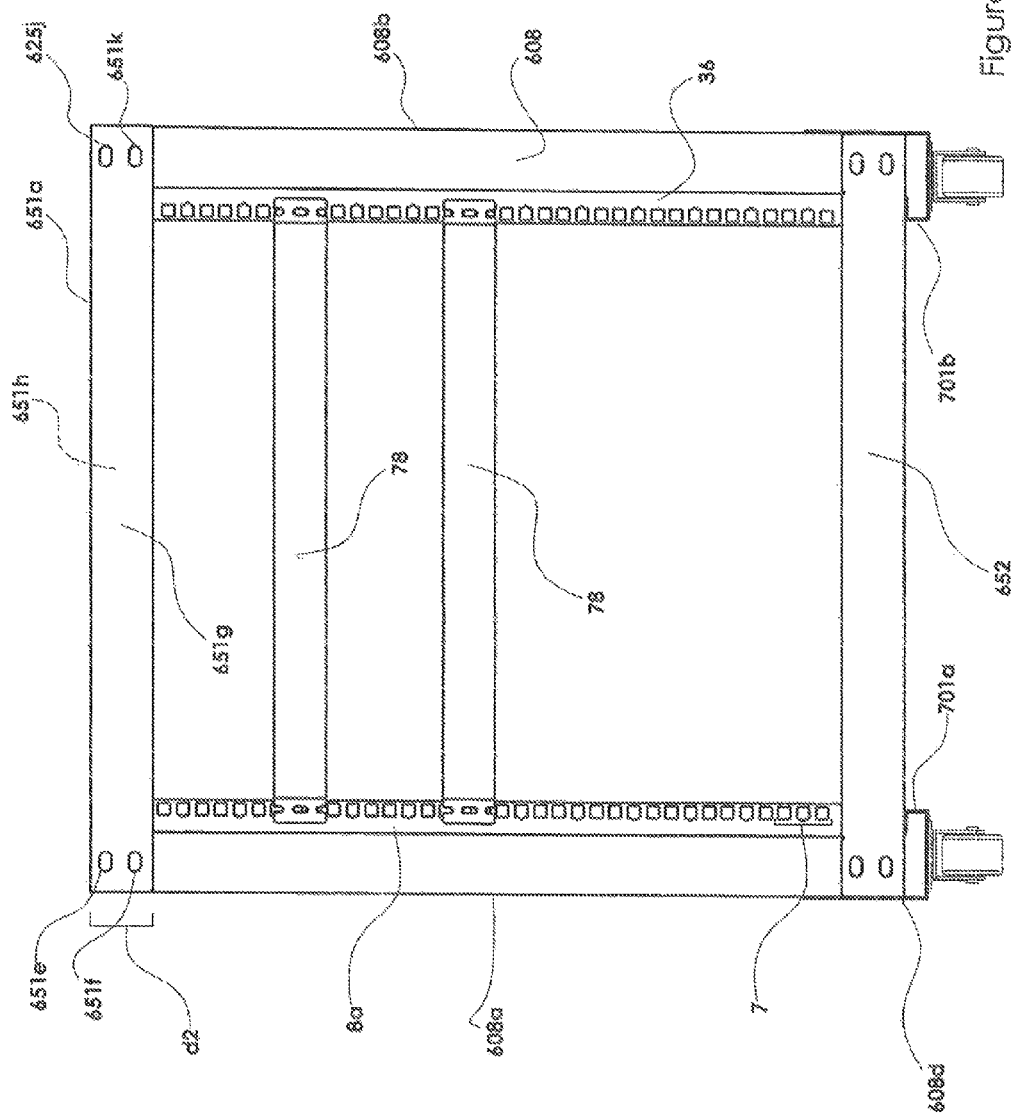
FIG. 9 is an anterior view of the third mount rack frame with attached vertically aligned devices.
Figure 17:
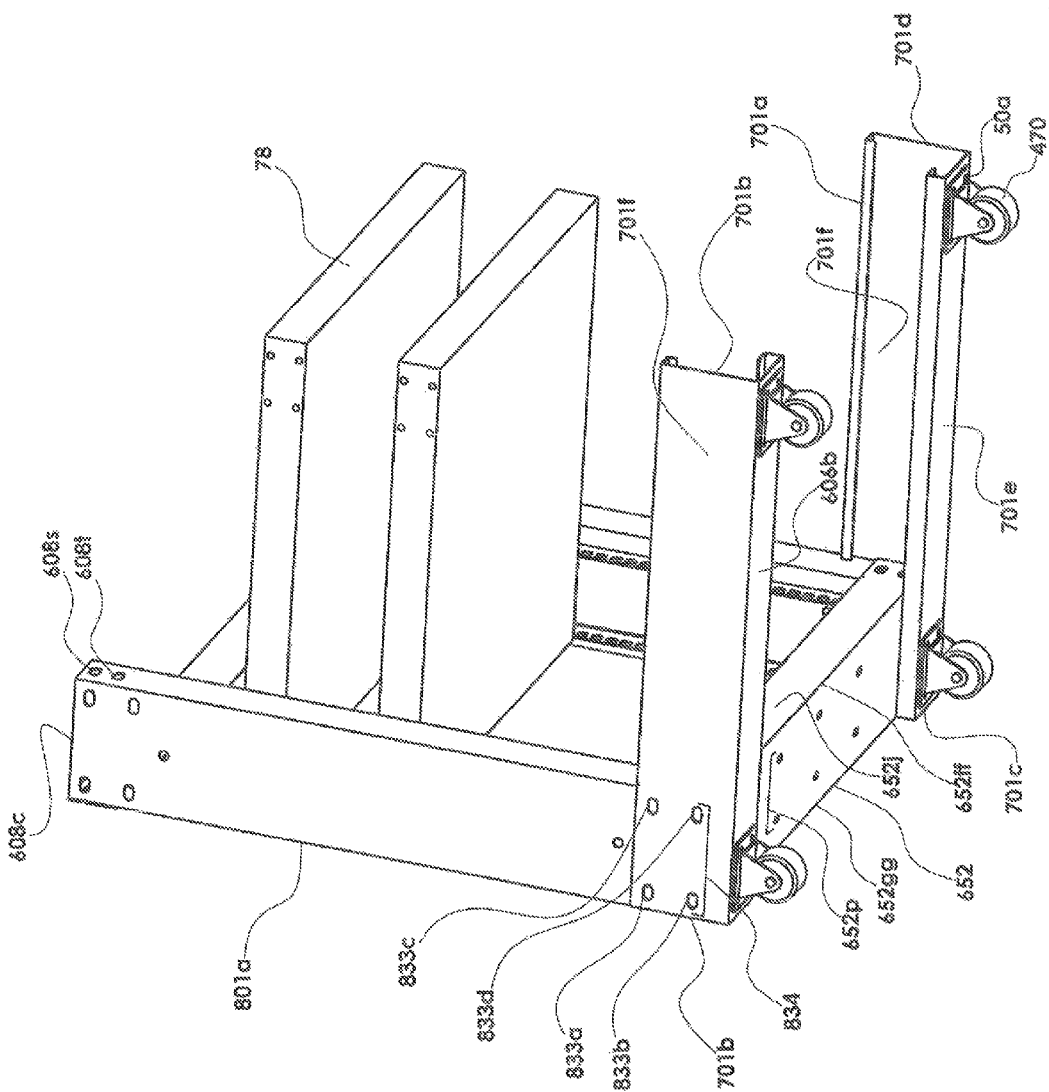
FIG. 17 is a partial lower view of the mount rack frame of FIG. 9.

Referring initially to FIGS. 9 and 17, third mount rack frame 608 is a free standing device which does not require attachment or support from exterior to frame 608, except for contact of lowermost leg surfaces 606*a*, 606*b*, casters or wheels 470 with horizontal surface 480. Third mount rack frame 608 remains freestanding without attachments and supports whenever it supports a maximum weight of vertically aligned stored devices 78. Third mount rack frame 608 does not require shelves to support stored and vertically aligned devices 78 between rigid vertical components 608*a*, 608*b* infra. Each rigid vertical component 608*a*, 608*b* is preferably (i) interchangeable with the other (ii) approximately twenty-five inches to eighty inches in longitudinal vertical height/longitudinal length 608*ee* (ii) two inches in posterior and anterior width infra, (iii) four and three-quarters inches in lateral width infra and (iii) approximately 1.5 millimeters in thickness.

Each rigid vertical component 608*a*, 608*b* has a first vertical end 608*c* and a second vertical end 608*d*. Each rigid vertical component 608*a*, 608*b* preferably (i) weighs approximately four pounds and seven ounces and (ii) is made of SPCC quality cold rolled steel. Each rigid vertical component 608*a*, 608*b* is more preferably made of a single integral SPCC quality cold rolled steel plate sheet 609 which is folded into the appropriate shapes and structural features. Each SPCC quality cold rolled steel plate sheet 609 is preferably approximately 1.5 millimeters in thickness, but other thicknesses and materials are also within the scope of the invention.

Figure 10:
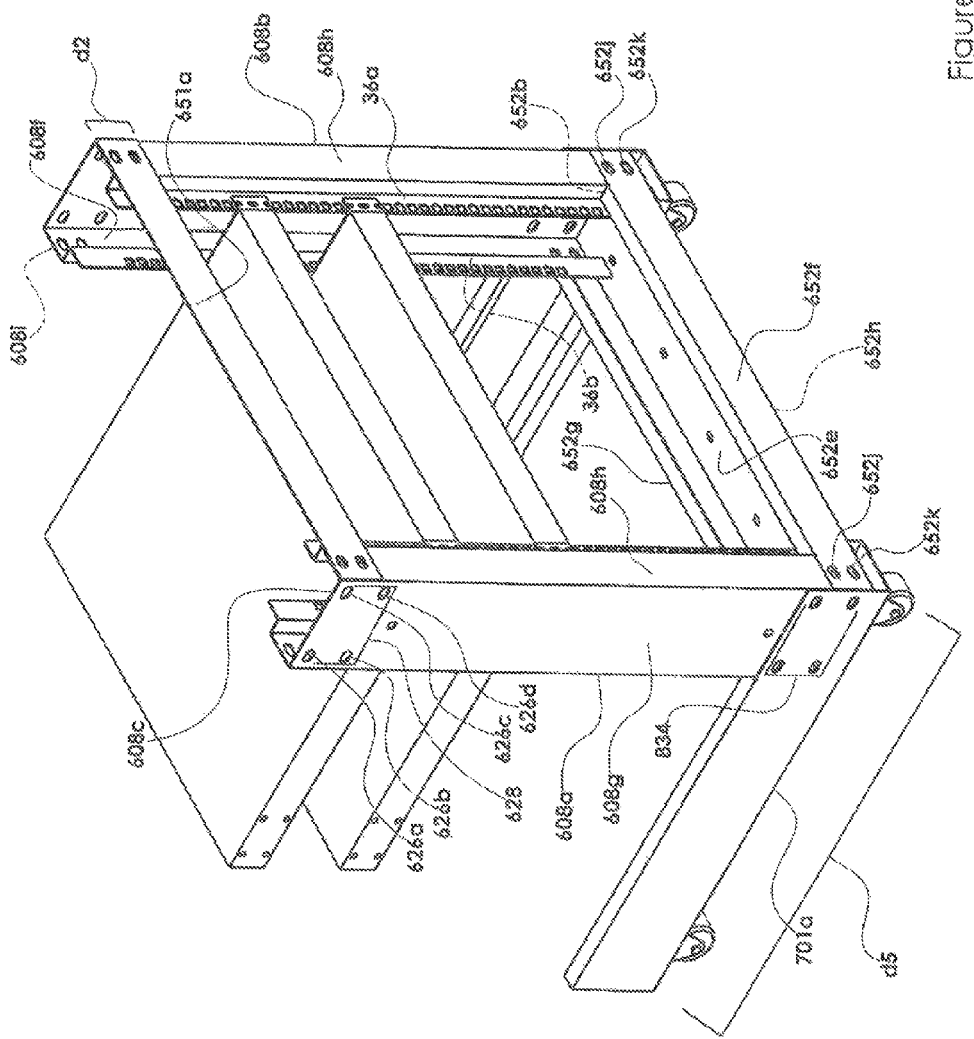
FIG. 10 is a partial anterior view of the mount rack frame of FIG. 9.
Figure 14:
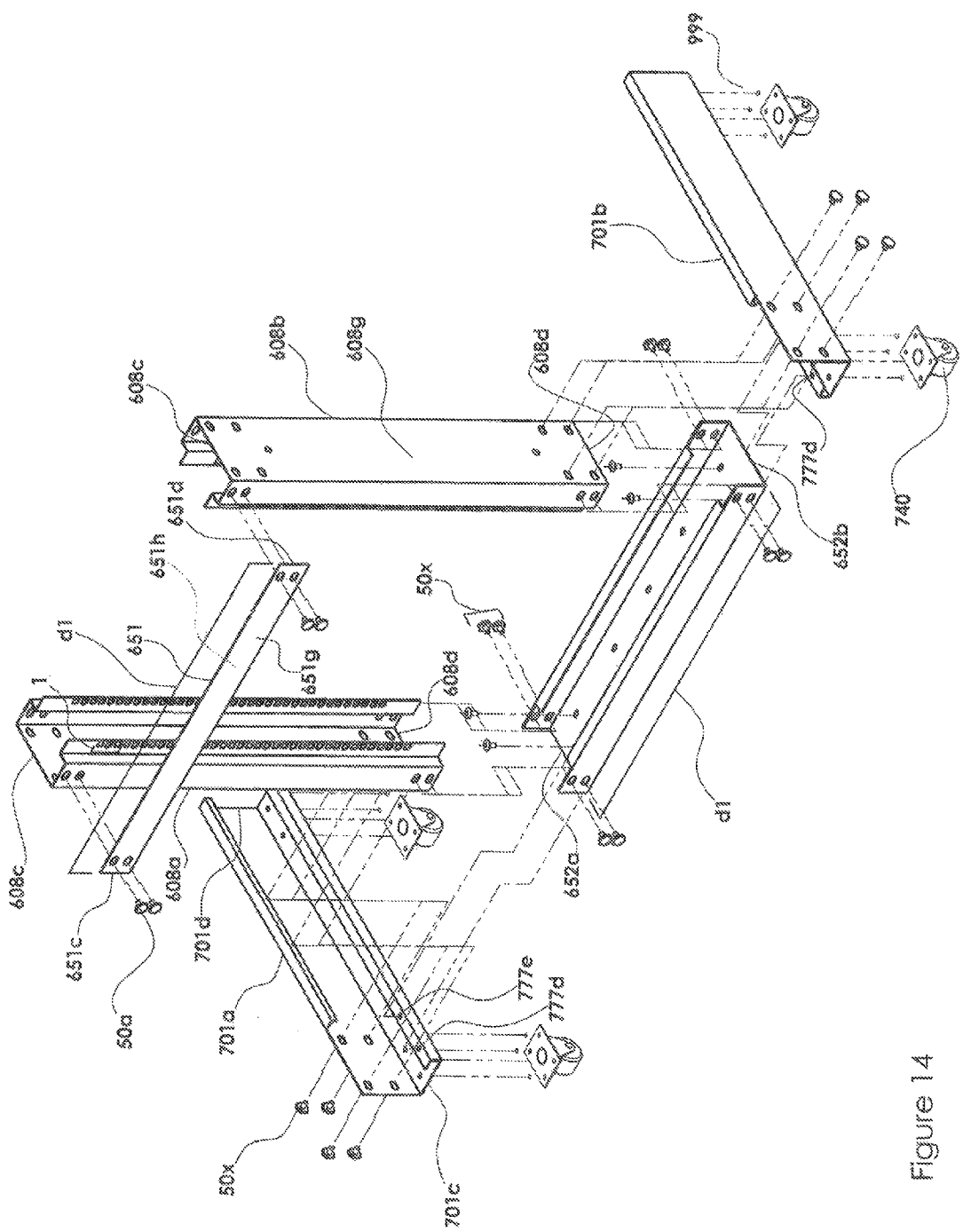
FIG. 14 is an exploded view of the mount rack frame of FIG. 9.

Third mount rack frame 608 can support a load of at least approximately four hundred pounds whenever this weight is directed vertically downward towards supporting surface 480. Each rigid vertical component 608*a*, 608*b* is preferably identical to the remaining rigid vertical component 608*a*, 608*b* in weight, height, width, structural features and other quantified dimensions. As best seen in FIGS. 10 and 14, each rigid vertical component 608*a*, 608*b* comprises a longitudinal vertical recess 608*f* which is co-extensive with each rigid vertical component vertical height/longitudinal length 608*ee*. Each rigid vertical component longitudinal recess 608*f* is preferably defined by a vertical component lateral side 608*g*, a vertical component anterior side 608*h* and a vertical component posterior side 608*i*.

Figure 16:
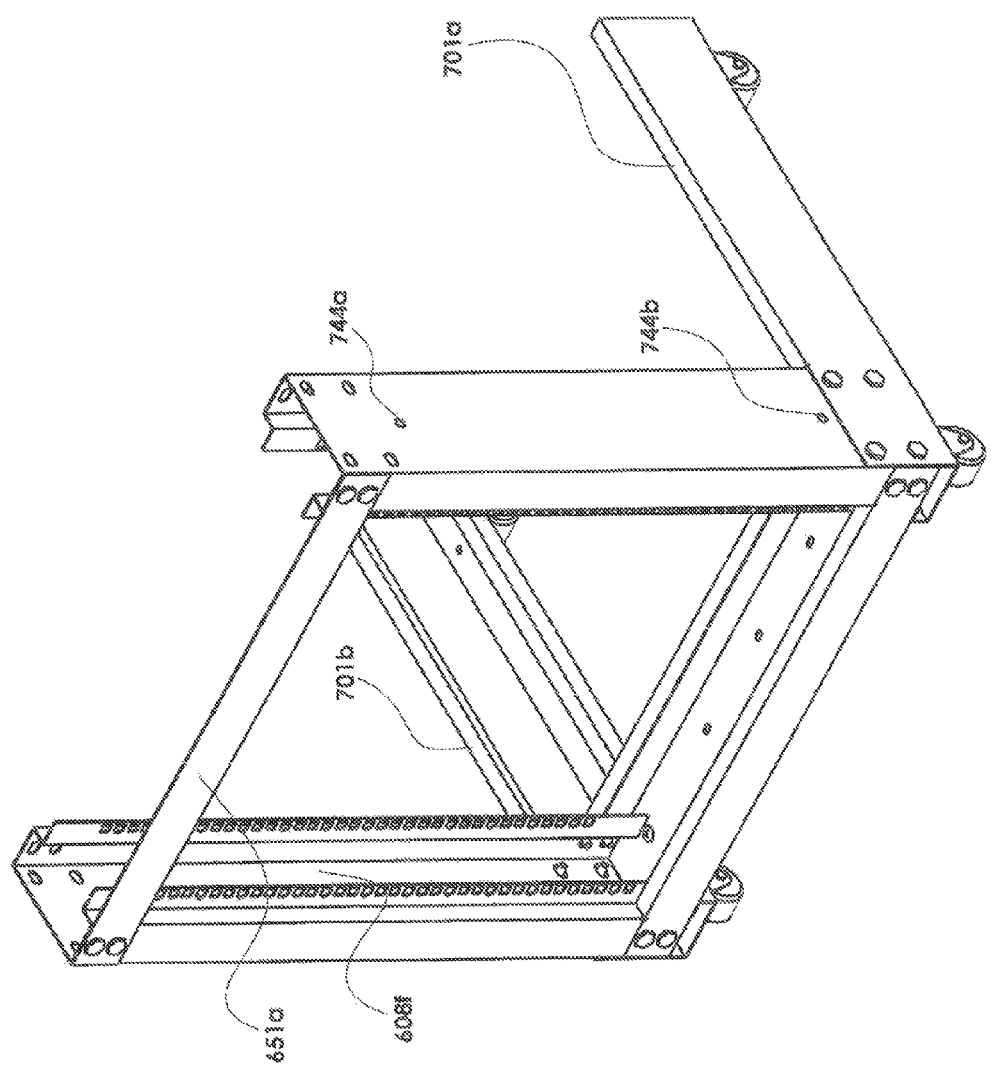
FIG. 16 is a partial anterior view of the mount rack frame of FIG. 9 without attached vertically aligned devices.

Vertical component sides 608*g*, 608*h* and 608*i* form a partial rectangular cross-section perpendicular to the longitudinal length 608*ee* of each rigid vertical component 608*a*, 608*b* in assembled frame 608. As seen in FIG. 17, each vertical component anterior side and vertical component posterior side 608*h*, 608*i* comprise first and second vertical component vertically aligned apertures 608*s*, 608*t* respectively at each rigid vertical component end 608*c*, 608*d*. Referring to FIG. 16, prior art power strip 600 reversibly attaches to one rigid vertical component 3 with small round screw 50*as* (not seen in this view) at each aperture 744*a*, 744*b* within each vertical component lateral side 608*g* as described supra for second mount rack frame 1.

Each vertical component side 608*g*, 608*h*, 608*i* is preferably (i) rigid and (ii) integrally continuous with at least one remaining vertical component side 608*g*, 608*h* and 608*i*. As best seen in FIG. 10, each rigid vertical component end 608*c*, 608*d* preferably comprises four individual apertures 626*a*, 626*b*,626*c*, 626*d* [hereinafter apertures 626]. Apertures 626 are configured as an aperture square 628 within corresponding single vertical component lateral side 608*g*. Each aperture 626 within aperture square 628 receives a mechanical fastener 999, preferably a threaded bolt 50*x*, to reversibly attach a rigid vertical component end 608*c*, 608*d* to a corresponding rigid right rack base leg 701*a* or rigid left rack base leg 701*b* as described infra.

Rigid vertical components 608*a*, 608*b* are not only interchangeable with each other, but are also interchangeable with respect to which vertical component end 608*c*, 608*d* attaches to a corresponding rigid horizontal component 651*a*, 652 or rack base leg 701*a*, 701*b*. Each aperture square 628 with inserted mechanical fasteners 999 that are preferably bolts 50*x* also mechanically attach and vertically align third mount rack frame 608, without the rack base legs 701*a*, 701*b* to a lower positioned rigid modular multi-component support structure 2*a*, 2*b* or 2. This vertical attachment preferably includes with connecting plates 90*a*, 90*b* as described supra for second mount rack frame 1. Referring to FIG. 10, each rigid vertical component 608*a*, 608*b* also comprises two parallel metal strips 36*a*, 36*b* with rack sets 7 of vertically aligned apertures 8 as described for second mount rack frame 1 supra. Mounting brackets 75 or other connecting devices attach stored devices 78 in vertical alignment at rack sets 7 as described supra for second mount rack frame 1.

Referring to FIGS. 9, 10, 13 and 14, third mount rack frame 608 preferably comprises an integral continuous upper rigid horizontal component 651a and an integral continuous lower rigid horizontal component 652. Each upper rigid horizontal component 651a is preferably approximately (i) 23.5 inches in longitudinal length d1. Upper rigid horizontal component 651a is preferably approximately (i) two inches in width d2 (ii) 1.5 millimeters in thickness and (ii) 10.4 ounces in weight. Upper rigid horizontal component 651a preferably includes a first upper horizontal component end 651c and a second upper horizontal component end 651d. Each rigid horizontal component 651a, 652 is preferably made of an SPCC quality cold rolled steel plate sheet 651x. Each upper horizontal component 651a is preferably integral and continuous with four smooth flat surfaces shaped as a rectangular solid. Most preferably these four surfaces include a first longitudinal side 651g and a second longitudinal side 651h.

Vertically aligned apertures 651e, 651f preferably penetrate first longitudinal side 651g and second longitudinal side 651h, and so upper longitudinal horizontal sides 651g, 651h are interchangeable with each other for attachment to rigid vertical components 608a, 608b. Each upper rigid horizontal component 651a preferably attaches to (i) both first and second rigid vertical component ends 608c, 608d at first horizontal component end 651c and second horizontal component end 651d (ii) at aligned vertically aligned apertures 651e, 651f respectively. For this attachment apertures 651e, 651f congruently align with apertures 608s, 608t at rigid vertical component 608a, 608b. A single mechanical fastener 999 (preferably a bolt 50x) inserts through each pair of congruently aligning apertures 651e, 651f and 608s, 608t within vertical component anterior side 608h or vertical component posterior side 608i. Vertically aligning apertures 651e, 651f and 607s, 608t are each preferably partially elliptical in shape.

Figure 13:
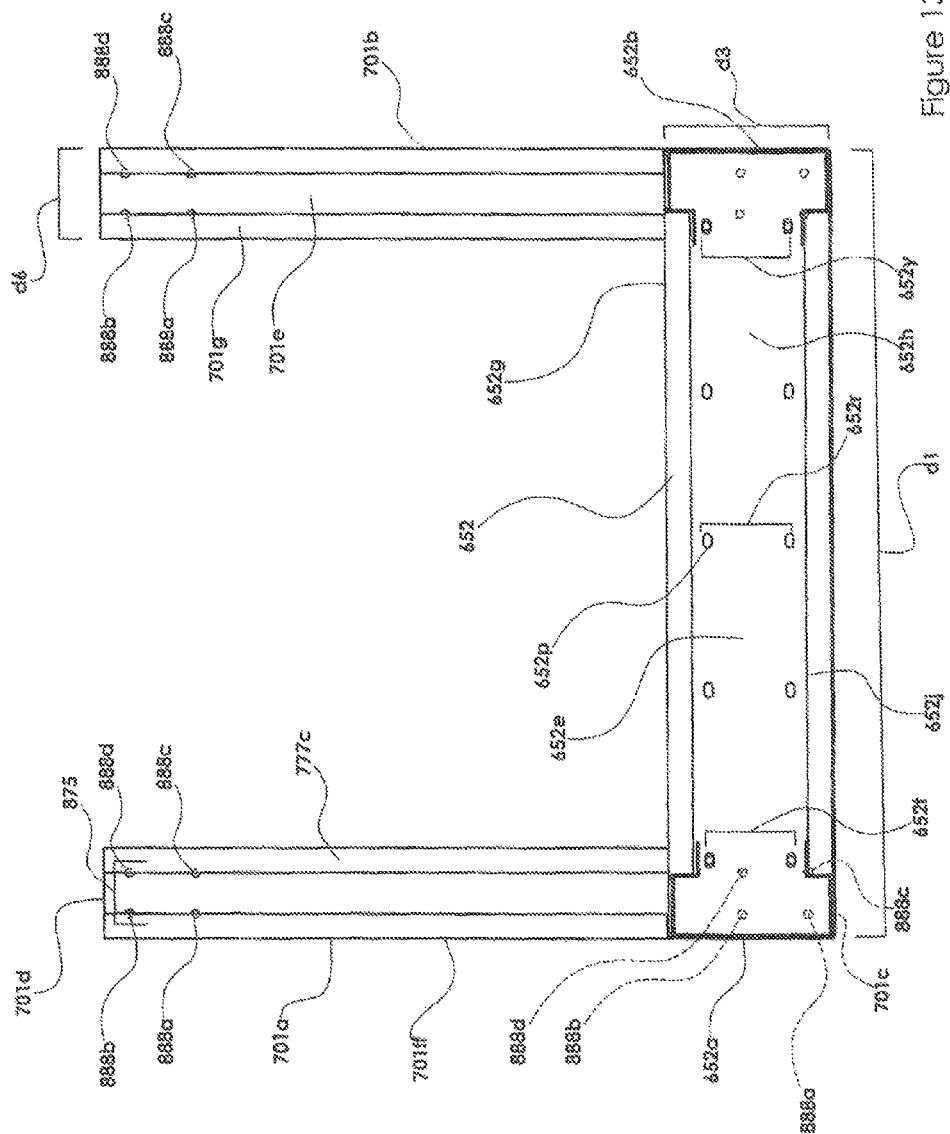
FIG. 13 is an upper plan view of the rack base legs and lower horizontal component of the mount rack frame of FIG. 9.

Referring to FIGS. 9, 13, 17 and 18, lower rigid horizontal component 652 is preferably made of a single integral SPCC quality cold rolled steel plate sheet 609 that is most preferably approximately 1.5 millimeters in thickness. Single plate sheet 609 is most preferably bent or folded to create the structural features described infra. Lower rigid horizontal component 652 is preferably approximately (i) 23.5 inches in longitudinal length d3 and (ii) four and three-quarters inches in width d3. Each rigid lower horizontal component preferably (i) weighs approximately three pounds and eleven ounces and (ii) is the same longitudinal length as upper rigid horizontal component 651a. Lower rigid horizontal component 652 preferably comprises a horizontal recess 652e, and horizontal recess 652e is preferably coextensive with the longitudinal length d1 of lower rigid horizontal component 652. FIGS. 13 and 14.

Lower horizontal component 652 also comprises a first lower horizontal component end 652a and a second lower horizontal component end 652b. Single horizontal recess 652e is bounded by first upwardly protruding horizontal component side 652f, second upwardly protruding horizontal component side 652g and lowermost component side 652h. Each upwardly protruding horizontal component side 652f, 652g is preferably approximately (i) two inches in height and (ii) twenty-three and five-eighths inches in longitudinal length.

Each side 652f, 652g preferably protrudes upwardly from first and second lower horizontal component edges 652ff, 652gg respectively integrally and at a right angle. Lower horizontal component sides 652f, 652g and 652h preferably are each continuous and integral with at least one remaining lower horizontal component side 652f, 652g and 652h. Each first upwardly protruding horizontal component side 652f and second upwardly protruding horizontal component side 652g preferably comprises a perpendicular flat continuous rigid lip 652u, 652v respectively that is preferably approximately (i) three-quarters inch in width and (ii) the same longitudinal length as its corresponding upwardly protruding side 652f, 652g.

Each upwardly protruding horizontal component side 652g, 652h at rigid horizontal component ends 652a, 652c comprises two vertically aligned apertures 652j, 652k. Apertures 652j, 652k congruently align with apertures 608s, 608t within interchangeable rigid vertical component posterior and anterior sides 608i, 608h. Most preferably vertically aligned apertures 652j, 652k
  (i) congruently align with vertically aligned apertures 608s, 608t at corresponding rigid vertical component ends 608c, 608d within vertical component anterior or posterior surfaces 608i, 608h
  (ii) to attach lower rigid horizontal component 652 with corresponding inserted mechanical fasteners 999, and most preferably bolts 50x, to rigid vertical components 608a, 608b.

Lower rigid horizontal component ends 652a, 652b are interchangeable with each other, and rigid vertical components 608a, 608b interchangeably attach to either lower horizontal component end 652a, 652b at either rigid vertical component end 15a, 15b.

As best seen in FIGS. 13 and 14, individual apertures 652p align in preferably five spaced aperture pairs 652r along rigid horizontal lowermost side 652h. Spaced aligned aperture pairs 652r are preferably aligned perpendicular to the longitudinal length d1 of lower rigid horizontal component 652. In the preferred embodiment of third mount rack frame 608, two most exterior horizontal component aligned aperture pairs 652t, 652y congruently align with apertures 777d, 777e within a rack base leg 701a, 701b infra. This congruent alignment with inserted mechanical fasteners 999, and most preferably screws 50a, reversibly or permanently attach each rack base leg 701a, 701b to a lower rigid horizontal component end 652a or 652b. In another embodiment of third mount rack frame 608, partially elliptical apertures within aligned aperture pairs 652r congruently align with aligned partially elliptical aperture pairs 16 within rigid horizontal components 4a, 4b of a rigid modular multi-component support structure 2a, 2b or 2. This congruent alignment provides reversible attachment with
  (i) corresponding inserted mechanical fasteners 999, preferably bolts 50x, within congruently aligned aperture pairs 652p and aperture pairs 16, and
  (ii) in a manner identical to vertical attachment and alignment for two or more rigid multi-component support structures 2a, 2b, 2 of second mount rack frame 1 supra.

With the above congruently aligned pairs 652r and 16 with corresponding inserted mechanical fasteners 999. there is reversible vertical attachment and alignment of third frame 608 without rack base legs 701a, 701b, infra to a rigid multi-component support structure 2a, 2b, 2. In addition to this attachment through aperture pairs 652p and 16, for this particular two-unit embodiment,
  (i) two vertically aligned rigid vertical support component ends 608c, 608d from two separate rigid vertical components 608a, 608b most preferably attach to each other with one rigid flat connecting plate 90a, 90b as described supra (ii) with congruently aligning plate apertures 92, vertical component aperture squares 628 and inserted corresponding mechanical fasteners 999 which are most preferably bolts 50x. FIGS. 15A and 15B.

Referring to FIGS. 9, 10, 11, 12 and 13, third mount rack frame 608 preferably comprises a single left rack base leg 701a and a single right rack base leg 701b. Each rack base leg 701a, 701b is most preferably approximately (i) twenty-two inches in longitudinal length d5 and (ii) two and seven-eighths inches in width d6. With these dimensions mount rack frame 601 remains free-standing and satisfactory for supporting a maximum load of approximately four hundred pounds of vertically aligned and supported devices 78. If a third mount rack frame 601 without rack base legs 701a, 701b vertically aligns with and attaches to a rigid modular multi-component support structure 2a, 2b, 2, see infra, without casters or wheel 470, then the maximum load becomes approximately eight hundred pounds. Implementation of four casters or wheels 470 as part of either a second mount rack frame or third mount rack frame 601 results in a maximum load of approximately 880 pounds.

Figure 12:
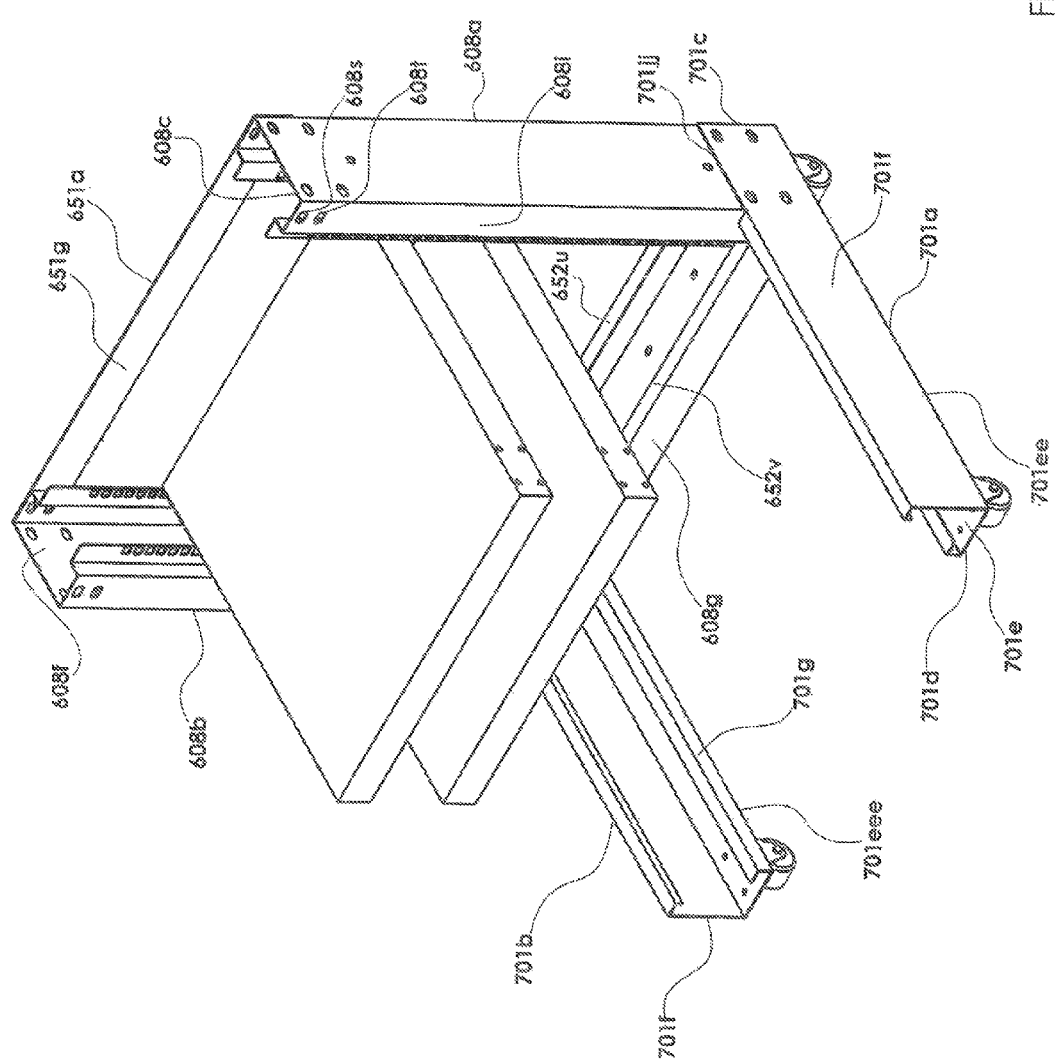
FIG. 12 is a partial posterior view of the mount rack frame of FIG. 9.

Each rack base leg 701a, 701b preferably (i) weighs approximately three pounds and two ounces and (ii) is made of a single integral SPP quality cold rolled steel plate sheet 909 that is preferably approximately 1.5 millimeters in thickness. Each single integral sheet 909 is preferably folded or otherwise bent to create the structural and quantified features of a single rack base leg 701a, 701b as described infra. As best seen in FIG. 12, each rack base leg 701a, 701b is preferably (i) identical to the remaining rack base leg 701a,701b in dimensions and structure. However, one leg is configured as a left rack base leg 701a while the remaining leg is configured as a right rack base leg 701b, and so they are not interchangeable within a third mount rack frame 608 with respect to each other. FIG. 12. Rack base legs 701a, 701b oppose each other and their longitudinal anterior-posterior length d5 are preferably parallel to each other in properly assembled frame 608. Rack base legs 701a, 701b are most preferably spaced approximately nineteen inches from each other in a properly assembled third rack frame 608.

Figure 11:
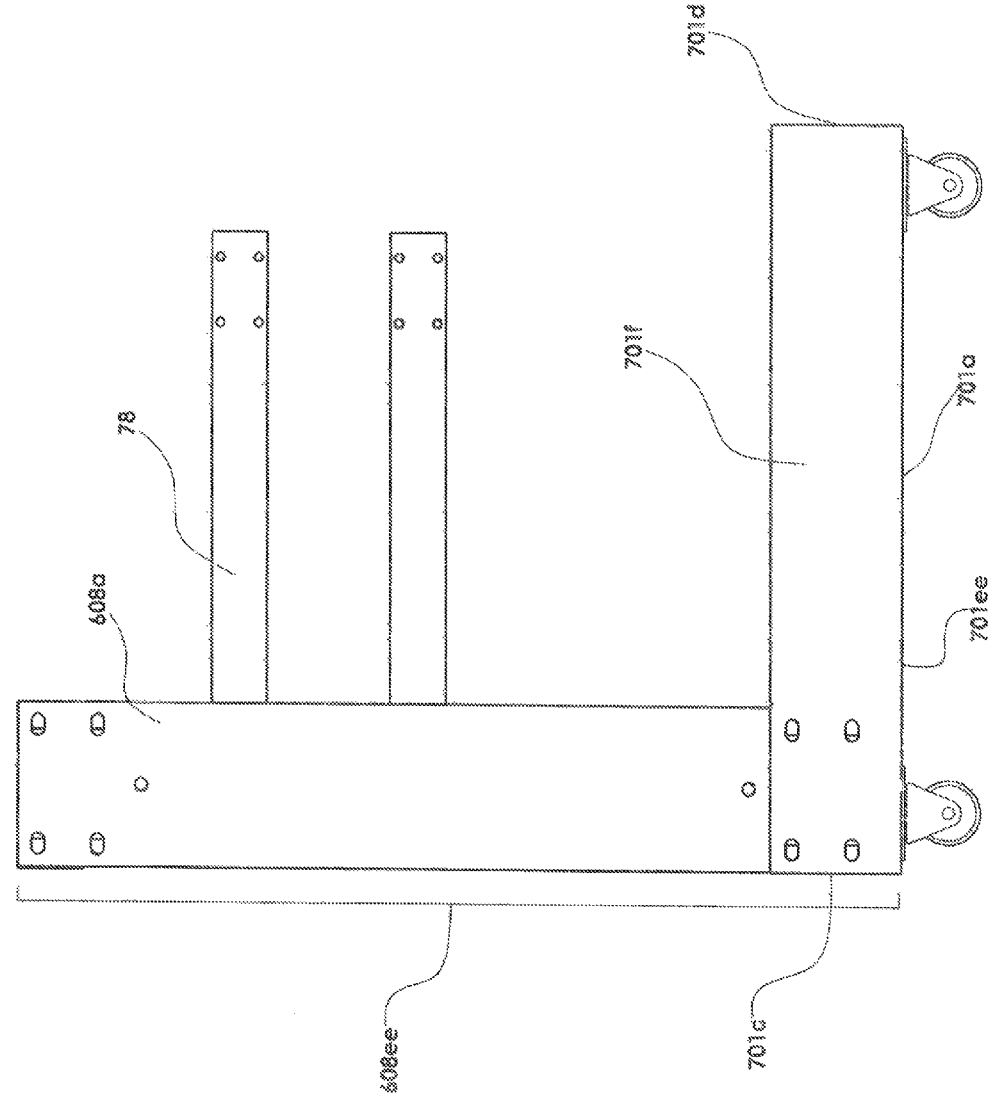
FIG. 11 is a lateral view of the mount rack frame of FIG. 9.

Referring in particular to FIGS. 11, 12 and 13, each rack base leg 701a, 701b has an anterior leg end 701c and a posterior leg end 701d. Each rack base leg 701a, 701b further integrally includes (i) a bottom leg side 701e, an upwardly protruding taller exterior leg side 701f and an upwardly protruding shorter interior leg side 701g. Preferably leg sides 701e, 701f, and 701g are integral and continuous with at least one remaining upwardly protruding leg side 701e, 701f, 701g. Each upwardly protruding side 701f, 701g respectively preferably protrudes upwardly from bottom leg side 701e in a perpendicular and continuous manner from bottom exterior leg side edge 701ee and bottom interior leg side edge 701eee respectively.

Still referring to FIGS. 11, 12 and 13, bottommost leg sides 701e and upwardly protruding sides 701f, 701g are each co-extensive with longitudinal length d5 of each rack base leg 701a, 701b. Bottommost leg side 701e width is co-extensive with width d6 of rack base leg 701a, 701b, while upwardly protruding taller exterior leg side 701f is preferably approximately three and seven-eighths inches in uniform height. Upwardly protruding smaller interior leg side 701g is preferably approximately three-quarters inch in uniform height. As best seen in FIG. 18, each upwardly protruding taller exterior leg side 701f includes an integrally attached perpendicular bent upper edge 777a that is preferably approximately sixteen and one-quarter inches in longitudinal length as measured from a corresponding rack base leg posterior end 701d. Perpendicular bent upper edge 777a is preferably approximately (i) three-quarters inch in width and (ii) co-extensive with integrally attached downwardly protruding bent upper lip 777b in longitudinal length. Downwardly protruding perpendicular bent upper lip 777b preferably (i) integrally and continuously attaches to bent upper edge 777a and is preferably (i) approximately three-eighths inch in width and (iii) sixteen and one-quarter inches in longitudinal length.

Referring to FIGS. 14 and 18, each upwardly protruding shorter interior leg side 701g includes a second integral continuous perpendicular bent face 777c that is preferably approximately (i) three-quarters inch in width and (ii) co-extensive with and the same longitudinal length as upwardly protruding interior small upper side 701f. Perpendicular bent edge 777c contains two longitudinally aligned threaded apertures 777d, 777e proximal to rack base leg anterior end 701c. Apertures 777d, 777e preferably
(i) congruently align with exteriorly positioned spaced aligned aperture pairs 652r and with corresponding inserted mechanical fasteners 999,
(ii) to reversibly attach a lower horizontal component end 652a, 652b to a corresponding rack base anterior end 701c. Most preferably congruently aligning pairs of apertures 777d, 777e and 652r each comprise a single inserted corresponding threaded round head fastening screw 50a. Inserted round head fastening screws 50a provide additional stability and sturdiness for third mount rack frame 601.

Referring to FIGS. 13 and 18, each rack base leg bottommost side 701e preferably comprises a bottom leg side aperture square 875 comprising four individual bottom side apertures 888a 888b, 888c and 888d [hereinafter individual bottom apertures 888]. Preferably there is a bottom leg side aperture square 875 at each anterior and posterior rack base leg end 701c, 701d along bottom rack leg side 701e. Bottom aperture squares 875 form part of the attachment of wheels and/or coasters 470 to third mount rack frame 608. In particular, each aperture of 888 of leg bottom side aperture square 875 preferably
   (i) reversibly attaches to a congruently aligning aperture of wheel or coaster 470a with
   (ii) inserted mechanical fasteners 999 that are most preferably small diameter round head screws 50a as described supra for second mount rack frame 1.
However, in other embodiments casters and/or wheels 470 are absent from third mount rack frame 608 without diminishing free-standing capability and maximum load capacity of third mount rack frame 608.

Referring in particular to FIGS. 10 and 17, each anterior rack base leg end 701c preferably comprises four individual apertures 833a, 833b, 833c, and 833d [hereinafter apertures 833] configured as a leg side rectangle 834 within a corresponding upwardly protruding taller exterior leg side 701f. Within each leg side rectangle 834 two horizontally aligned individual apertures 833 are preferably spaced from each other by approximately 3.5 inches, while two vertically aligned apertures 833 are preferably spaced from each other by approximately 1.75 inches (i.e., from the edge of one aperture 833 closest to the adjoining aperture 833 closest edge). In a properly assembled third mount rack frame 608, apertures 833 of each leg square 834
   (i) congruently align with individual apertures 626 of a corresponding aperture square 628
   (ii) within a vertical component lateral side 608g at vertical component end 601c or 601d, and (iii) thereby reversibly or permanently attach a rigid vertical component 608a, 608b to a single rack base leg 701a, 701b (iv) with corresponding inserted mechanical fasteners 999 that are most preferably threaded bolts 50x.

The two vertically aligned apertures 833 within a leg aperture square 834 most proximal to the corresponding anterior rack base leg end 701c preferably are located approximately 0.71875 inch from (i) the corresponding anterior rack base end 701c and (ii) uppermost taller exterior edge 701ff of taller upwardly protruding leg side 701f (i.e., from the edge of each aperture 833 closest to the anterior leg edge at 701c or edge 701ff). Devices 78 attach to rigid vertical components 608a, 608b as described supra for second mount rack frame 1. Even when bearing a maximum load of four hundred pounds from attached devices 78, none of the above disclosed frames or their embodiments require attachment or support from other structures for a free-standing capability, except for contact of rack base legs 701a, 701b and/or coasters or wheels 470 along horizontal surface 480.

Each rigid vertical support end 608c or 608d preferably fits snugly within a corresponding partial recess formed by (i) upwardly protruding exterior taller rack leg side 701f and upwardly protruding interior smaller rack base side 701g as well as (ii) each lower rigid horizontal component upwardly protruding side 652f, 652g. Each rigid vertical component 608a, 608b thereby attaches perpendicular to (i) each rack base leg 701a, 701b and (ii) lower rigid horizontal components 651a and 652. Each rigid vertical component 608a, 608b also preferably attaches in a flush manner to each rack base anterior leg end 701c, minus the thickness of intervening lower rigid horizontal component 652.

Assembly of Third Mount Rack Frame 608

Referring to FIG. 14, the operator initially congruently aligns partially elliptical apertures 652j, 652k with partially elliptical apertures 608s and 608t respectively of a first rigid vertical component 608a or 608b. The operator then inserts and tightens preferably one bolt 50x through each of two congruently aligned partially elliptical apertures 652j,608s and 652k, 608t. The operator repeats this process for the remaining rigid horizontal end 652a or 652b with partially elliptical apertures 608s, 608t of a second rigid vertical component 608a or 608b. The operator then inserts and tightens preferably one bolt 50x through congruently aligning aperture pairs 651e, 608s and 651f, 608t to attach upper rigid horizontal component 651a to the same two rigid vertical components 608a, 608b as lower rigid horizontal component 652.

Rack base legs 701a, 701b attach to each rigid vertical component 608a, 608b in a manner identical to that described for second mount rack frame 1 supra, while wheels/coasters 470 attach to rack base legs 701a, 701b as described supra for second mount rack frame 1. Each rack base leg 70a1, 701b attaches to a rigid lower horizontal component 652 with inserted mechanical fasteners 999, preferably screws 50a, as described supra through apertures 652r and 777d, 777e.

Materials and Production of Second Mount Rack Frame 1 and Third Mount Rack Frame 608 in the Best Mode and Preferred Embodiment(s)

Rigid vertical components 3a, 3aa, 3b, 3b and rigid horizontal components 4a, 4aa, 4b, 4bb are preferably made of SPCC quality cold rolled steel. However, materials such as copper or other rigid materials are also satisfactory for second mount rack frame 1 as well as third mount rack frame 608. Small round screws 50a, 50b, 50g, 50k, are preferably made of SPCC quality cold rolled steel, but materials such as copper or other rigid materials are also satisfactory. Straight base legs 471a, 471b, rack base legs 71a, 71b, 701a, 701b are preferably made of SPCC quality cold rolled steel, but copper or other rigid materials are also satisfactory. Bolts 50x are preferably made of steel but other materials such as iron are also satisfactory.

Cold rolled steel is one of the widely used flat components used in constructing automobiles, home appliances, steel furniture and other equipment. Cold rolling is a well known prior art method of metal treatment wherein microscopic defects in the metal are nucleated throughout deformed area(s). Cold rolling increases the hardness and strength of a metal, but cold rolling also results in a large decrease in ductility. Mechanical attachments to wheels and coasters 470, 70 are preferably made of SPCC cold rolled steel, but copper or other rigid materials are also satisfactory in both the second mount rack frame 1 and third mount rack frame 608. Cage nuts 59 and washers 50d are preferably made of SPCC quality cold rolled steel, but copper or other rigid materials are also satisfactory in both the second mount rack frame 1 and the third mount rack frame 608. Prior art connecting brackets 75 are preferably made of SPCC quality cold rolled steel, but copper or other rigid materials are also satisfactory in both the second mount rack frame and third mount rack frame 608.

Factory production of second mount rack frames 1 and third mount rack frame 601 components proceeds as follows:
(a) Mold production;
(b) Shear of SPCC cold rolled steel plate sheets by numerically controlled computers;
(c) Punching of sheared plate sheets;
(d) Bending and folding of sheared SPCC cold rolled steel plate sheets by numerically controlled computers; and
(e) Application of a surface finish to the SPCC cold rolled steel plate sheets which includes:
   (1) degreasing;
   (2) acid pickling;
   rust prevention and parkerizing applications;
   (4) pure water cleaning; and
   (5) static electricity prevention plastic which is painted upon the metal surfaces.

The above text describes the preferred embodiment and other embodiments for the second mount rack frame 1 and third mount rack frame 608, as well as the best mode of their applications. However, those skilled in this art may envision other possible variations within the invention's scope. Accordingly, since our invention is possible in other specific forms without departing from the sprit or essential characteristic thereof, the embodiments described herein are considered in all respects illustrative and not restrictive.

The invention claimed is:

1. A mount rack frame comprising a first rigid multi-component support structure, a second rigid multi-component support structure and a rack base, A. said rack base comprising a physically and structurally separate and distinct structure from said first rigid multi-component support structure and said second rigid multi-component support structure, said first rigid multi-component support structure and said second rigid multi-component support structure each comprising two rigid vertical components and two rigid horizontal components, said two rigid vertical components aligned parallel to and opposing each other, and said two rigid horizontal components being parallel to and opposing each other, each said rigid vertical component comprising a single vertical longitudinal length, and each said rigid horizontal component comprising a single horizontal longitudinal length, said rigid horizontal components and said rigid vertical components each being reversibly removable from each other and physically distinct and structurally separate from each other, said first rigid multi-component support structure and said second rigid multi-component support structure each reversibly attaching to said rack base simultaneously, said mount rack frame further comprising B. A first set of apertures and a first group of mechanical fasteners reversibly vertically attaching and reversibly vertically aligning said first rigid multi-component support structure to a third multi-component rigid support structure, a second set of apertures and a second group of mechanical fasteners reversibly vertically attaching and reversibly vertically aligning said second rigid multi-component support structure to a fourth said rigid multi-component support structure, C. A third set of apertures and a third group of mechanical fasteners reversibly attaching said rigid vertical components to said rigid horizontal components, and said third group of mechanical fasteners continuously adjusting a linear dimension solely within said third set of apertures, and C. A fourth set of apertures and a fourth group of mechanical fasteners, said fourth group of mechanical fasteners reversibly attaching said rigid vertical components to said rack base, and D. A fifth set of apertures and a fifth group of mechanical fasteners reversibly attaching mounted devices to said rigid vertical components, said fifth group of mechanical fasteners being the sole attachment of said mounted devices to said rigid vertical components, said rigid vertical components being reversibly interchangeable with each other, and said rigid horizontal components being reversibly interchangeable with each other.

2. The mount rack frame of claim 1 wherein said third set of apertures comprises a plurality of individual apertures, said individual apertures each being partially elliptical in shape.

3. The mount rack frame of claim 1 wherein said mount rack frame is free standing without mechanical attachments or support from other surfaces or objects external to said mount rack frame except for a flat surface.

4. A mount rack frame comprising a first rigid multi-component support structure, a second rigid multi-component support structure and a rack base, A. said rack base comprising a physically and structurally separate and distinct structure from said first rigid multi-component support structure and said second rigid multi-component support structure, said first rigid multi-component support structure and said second rigid multi-component support structure each comprising two rigid vertical components and two rigid horizontal components, said two rigid vertical components aligned parallel to and opposing each other, and said two rigid horizontal components being parallel to and opposing each other, each said rigid vertical component comprising a single vertical longitudinal length, and each said rigid horizontal component comprising a single horizontal longitudinal length, said rigid horizontal components and said rigid vertical components each being reversibly removable from each other and physically distinct and structurally separate from each other, said first rigid multi-component support structure and said second rigid multi-component support structure each reversibly attaching to said rack base simultaneously, said mount rack frame further comprising B. A first set of apertures and a first group of mechanical fasteners reversibly vertically attaching and reversibly vertically aligning said first rigid multi-component support structure to a third multi-component rigid support structure, a second set of apertures and a second group of mechanical fasteners reversibly vertically attaching and reversibly vertically aligning said second rigid multi-component support structure to a fourth said rigid multi-component support structure, C. A third set of apertures and a third group of mechanical fasteners reversibly attaching said rigid vertical components to said rigid horizontal components, and said third group of mechanical fasteners continuously adjusting a linear dimension solely within said third set of apertures, and C. A fourth set of apertures and a fourth group of mechanical fasteners, said fourth group of mechanical fasteners reversibly attaching said rigid vertical components to said rack base, and D. A fifth set of apertures and a fifth group of mechanical fasteners reversibly attaching mounted devices to said rigid vertical components, said fifth group of mechanical fasteners being the sole attachment of said mounted devices to said rigid vertical components, said rigid vertical components being reversibly interchangeable with each other, and said rigid horizontal components being reversibly interchangeable with each other, and wherein each said rigid multi-component support structure functions independently without remaining said rigid multi-component support structures, and wherein each said rigid multi-component support structure reversibly and mechanically attaches to said rack base, said rigid multi-component support structures being reversibly interchangeable with each other.

5. A mount rack frame comprising one rigid multi-component support structure, inserted mechanical fasteners, and a rack base, said rack base being structurally different from said multi-component support structure, said rack base reversibly attaching to said rigid multi-component support structure, said one multi-component support structure comprising two rigid vertical components and two rigid horizontal components, said rigid vertical components and said rigid horizontal components being reversibly removable from each other and physically separate and distinct from each other, each said rigid vertical component comprising a vertical longitudinal length and each said rigid horizontal component comprising a horizontal longitudinal length, said mount rack frame further comprising A. A first set of apertures and a first group of mechanical fasteners reversibly inserting within said first set of apertures, each said rigid vertical component attaching to a respective rack base leg of said rack base by four of said first group of said mechanical fasteners configured in a square, B. A second set of apertures positioned along said longitudinal length of each said rigid horizontal component, said second set of apertures containing a second group of mechanical fasteners, said second set of apertures comprising a first group of at least three aligned aperture pairs, said second group of mechanical fasteners reversibly and vertically attaching said one rigid multi-component support structure to another single said multi-component support structure in vertical alignment, and C. A third set of apertures and a third group of mechanical fasteners, said third group of said mechanical fasteners continuously adjusting a linear dimension solely within individual apertures of said third set of apertures without removal of said mechanical fasteners from said third set of apertures, said third set of apertures comprising a third group of said aligned aperture pairs, said third group of said mechanical fasteners attaching said rigid horizontal components to said rigid vertical components, and D. A fourth set of apertures and a fourth group of said mechanical fasteners, said fourth group of said mechanical fasteners reversibly attaching mounted devices to said rigid vertical components, said mechanical fasteners being the sole support and attachment of said mounted devices to said mount rack frame and each said rigid multi-component support structure functioning independently without remaining said rigid multi-component support structures, and wherein each said rigid multi-component support structure reversibly attaches to said rack base.

6. A mount rack frame comprising a single rigid multi-component support structure and a single reversibly attaching rack base, said single rigid multi-component support structure comprising two rigid horizontal components and two rigid vertical components, said rigid horizontal components and said rigid vertical components reversibly attaching to each other to form a four-sided polygon, and each said rigid horizontal component being physically separate and distinct from each said rigid vertical component and remaining said rigid horizontal component, and each said rigid vertical component being physically separate and distinct from each said rigid horizontal component and remaining said rigid vertical component, said rack base comprising a first rack base leg and a second rack base leg, said first rack base leg and said second rack base leg each comprising a longitudinal length, said longitudinal length being approximately twenty inches, each said rigid vertical component attaching perpendicular to a said corresponding rack base leg approximately three inches from a corresponding anterior end, said mount rack frame being free standing without mechanical supporting attachments to a surface or other object wherein said surface or said other object is not part of said mount rack frame.

7. The mount rack frame of claim 6 wherein said mount rack frame is free standing without additional supporting components of said mount rack frame, and wherein said supporting components are designed for support of stored devices, said stored devices being heat generating and asymmetrically attaching to said mount rack frame.

8. A mount rack frame comprising a first rigid multi-component support structure, a second rigid multi-component support structure and a rack base, A. said rack base comprising a physically and structurally separate and distinct structure from said first rigid multi-component support structure and said second rigid multi-component support structure, said first rigid multi-component support structure and said second rigid multi-component support structure each comprising two rigid vertical components and two rigid horizontal components, said two rigid vertical components aligned parallel to and opposing each other, and said two rigid horizontal components being parallel to and opposing each other, each said rigid vertical component comprising a single vertical longitudinal length, and each said rigid horizontal component comprising a single horizontal longitudinal length, said rigid horizontal components and said rigid vertical components each being reversibly removable from each other and physically distinct and structurally separate from each other, said first rigid multi-component support structure and said second rigid multi-component support structure each reversibly attaching to said rack base simultaneously, said mount rack frame further comprising B. A first set of apertures and a first group of mechanical fasteners reversibly vertically attaching and reversibly vertically aligning said first rigid multi-component support structure to a third multi-component rigid support structure, a second set of apertures and a second group of mechanical fasteners reversibly vertically attaching and reversibly vertically aligning said second rigid multi-component support structure to a fourth said rigid multi-component support structure, C. A third set of apertures and a third group of mechanical fasteners reversibly attaching said rigid vertical components to said rigid horizontal components,
and
said third group of mechanical fasteners continuously adjusting a linear dimension solely within said third set of apertures,
and
D. A fourth set of apertures and a fourth group of mechanical fasteners,
said fourth group of mechanical fasteners reversibly attaching said rigid vertical components to said rack base,
and
E. A fifth set of apertures and a fifth group of mechanical fasteners reversibly attaching mounted devices to said rigid vertical components,
said fifth group of mechanical fasteners being the sole attachment of said mounted devices to said rigid vertical components,
said rigid vertical components being reversibly interchangeable with each other,
and
said rigid horizontal components being reversibly interchangeable with each other,
said mount rack frame not comprising shelves unless said shelves comprise said mounted devices.

9. A mount rack frame comprising
A. one single multi-component modular rigid support structure, said single multi-component modular rigid support structure being continuously polygonal,
said single multi-component modular rigid support structure comprising rigid horizontal components and rigid vertical support components,
said rigid horizontal components being reversibly separated from said rigid vertical components, and said rigid horizontal components being separate and distinct components from said rigid vertical components,
and
B. a rack base,
said rack base comprising two rack base legs, said two rack base legs being the sole support of said mount rack frame, said mount rack frame not attaching to supporting structures exterior to said mount rack frame,
said rack base legs comprising a longitudinal length, said longitudinal length of each said rack base leg being equivalent to a remaining rack base leg,
said rigid horizontal components each comprising at least four aligned aperture pairs, each of said aligned aperture pairs congruently aligning with another at least four aligned aperture pairs within another rigid horizontal component,
said aperture pairs each comprising individual apertures, and each said individual aperture containing a single inserted corresponding mechanical fastener,
said inserted corresponding mechanical fasteners reversibly attaching and reversibly aligning said mount rack frame to another single rigid multi-component support structure,
whereby
said mount rack frame increases in height and storage capacity by said vertical alignment of said another single multi-component modular rigid support structure upon said mount rack frame,
said vertical rigid components attaching to said rack base, said rigid vertical components comprising mechanical structural features for two-point attachment of stored devices,
said stored devices comprising lateral sides,
said stored devices attaching to said mechanical structural features for two point attachments along said lateral sides, said mechanical structural features for two point attachments comprising the sole attachment of said devices to said mount rack frame,
and each said rack base leg comprising single rack base leg anterior ends, and
each said rigid vertical component attaching to a respective one of said single anterior end of a corresponding said rack base leg, and
each said rack base leg is approximately twenty inches in longitudinal length and each said rigid vertical component attaches approximately three inches from said corresponding said rack base leg anterior end.

10. A mount rack frame comprising multi-component modular rigid support structures,
said multi-component modular rigid support structures attaching to devices by two point and four point attachments and,
wherein each said four-point attachment is located along a first multi-component modular rigid support structure and a second rigid multi-component modular rigid support structure of said multi-component modular rigid support structures,
and
each said two-point attachment is located exclusively along said first rigid multi-component modular rigid support structure or said second rigid multi-component modular support structure,
said first rigid multi-component modular rigid support structure and said second rigid multi-component support structure not physically attaching to one another,
said first rigid multi-component modular rigid support structure and said second rigid multi-component support structure each attaching to a rack base,
said four point attachments attaching exclusively to the anterior segments and posterior segments of said devices,
said two point attachments attaching exclusively to said anterior segments of said devices,
each said multi-component modular rigid support structure comprising interchangeable rigid horizontal components,
each said multi-component modular rigid support structure comprising interchangeable rigid vertical support components,
said mount rack frame being structurally adapted to increase storage space by vertical alignment and anterior-posterior longitudinal alignment of said multi-component modular rigid support structures.

11. The mount rack frame of claim 10 further comprising openings within said rigid horizontal components for linear adjustments between said rigid vertical support components,
said rack base comprising rack base legs,
each said rack base leg comprising a posterior end, and
wherein two opposing said rigid vertical components each attach flush with a corresponding rack base leg posterior end, said mount rack frame attaching to asymmetrically attaching and heat generating devices.

12. A mount rack frame comprising a first rigid multi-component support structure, a second rigid multi-component support structure and a rack base, A. said rack base comprising a physically and structurally separate and distinct structure from said first rigid multi-component support structure and said second rigid multi-component support structure, said first rigid multi-component support structure and said second rigid multi-component support structure each comprising two rigid vertical components and two rigid horizontal components, said two rigid vertical components aligned parallel to and opposing each other, and said two rigid horizontal components being parallel to and opposing each other, each said rigid vertical component comprising a single vertical longitudinal length, and each said rigid horizontal component comprising a single horizontal longitudinal length, said rigid horizontal components and said rigid vertical components each being reversibly removable from each other and physically distinct and structurally separate from each other, said first rigid multi-component support structure and said second rigid multi-component support structure each reversibly attaching to said rack base simultaneously, said mount rack frame further comprising B. A first set of apertures and a first group of mechanical fasteners reversibly vertically attaching and reversibly vertically aligning said first rigid multi-component support structure to a third multi-component rigid support structure, a second set of apertures and a second group of mechanical fasteners reversibly vertically attaching and reversibly vertically aligning said second rigid multi-component support structure to a fourth said rigid multi-component support structure, C. A third set of apertures and a third group of mechanical fasteners reversibly attaching said rigid vertical components to said rigid horizontal components, and said third group of mechanical fasteners continuously adjusting a linear dimension solely within said third set of apertures, and D. A fourth set of apertures and a fourth group of mechanical fasteners, said fourth group of mechanical fasteners reversibly attaching said rigid vertical components to said rack base, and E. A fifth set of apertures and a fifth group of mechanical fasteners reversibly attaching mounted devices to said rigid vertical components, said fifth group of mechanical fasteners being the sole attachment of said mounted devices to said rigid vertical components, said rigid vertical components being reversibly interchangeable with each other, and said rigid horizontal components being reversibly interchangeable with each other, and wherein said rack base comprises two rack base legs, each said rack base leg being approximately thirty inches in anterior-posterior longitudinal length, and wherein said mount rack frame is free standing and does not attach to or receive support from structural features external to said frame except for contact with a single flat surface.

13. A mount rack frame comprising

A. one single multi-component modular rigid support structure, said single multi-component modular rigid support structure being continuously polygonal, said single multi-component modular rigid support structure comprising rigid horizontal components and rigid vertical support components, said rigid horizontal components being reversibly separated from said rigid vertical components, and said rigid horizontal components being separate and distinct components from said rigid vertical components, and B. a rack base, said rack base comprising two rack base legs, said two rack base legs being the sole support of said mount rack frame, said mount rack frame not attaching to supporting structures exterior to said mount rack frame, said rack base legs comprising a longitudinal length, said longitudinal length of each said rack base leg being equivalent to a remaining rack base leg, said rigid horizontal components each comprising at least four aligned aperture pairs, each of said aligned aperture pairs congruently aligning with another at least four aligned aperture pairs within another rigid horizontal component, said aperture pairs each comprising individual apertures, and each said individual aperture containing a single inserted corresponding mechanical fastener, said inserted corresponding mechanical fasteners reversibly attaching and reversibly aligning said mount rack frame to another single rigid multi-component support structure, whereby Said mount rack frame increases in height and storage capacity by said vertical alignment of said another single multi-component modular rigid support structure upon said mount rack frame, said vertical rigid components attaching to said rack base, said rigid vertical components comprising mechanical structural features for two-point attachment of stored devices, said stored devices comprising lateral sides, said stored devices attaching to said mechanical structural features for two point attachments along said lateral sides, said mechanical structural features for two point attachments comprising the sole attachment of said devices to said mount rack frame.

14. A mount rack frame comprising a first rigid multi-component support structure, a second rigid multi-component support structure and a rack base, A. said rack base comprising a physically and structurally separate and distinct structure from said first rigid multi-component support structure and said second rigid multi-component support structure, said first rigid multi-component support structure and said second rigid multi-component support structure each comprising two rigid vertical components and two rigid horizontal components, said two rigid vertical components aligned parallel to and opposing each other, and said two rigid horizontal components being parallel to and opposing each other, each said rigid vertical component comprising a single vertical longitudinal length, and each said rigid horizontal component comprising a single horizontal longitudinal length, said rigid horizontal components and said rigid vertical components each being reversibly removable from each other and physically distinct and structurally separate from each other, said first rigid multi-component support structure and said second rigid multi-component support structure each reversibly attaching to said rack base simultaneously, said mount rack frame further comprising B. A first set of apertures and a first group of mechanical fasteners reversibly vertically attaching and reversibly vertically aligning said first rigid multi-component support structure to a third multi-component rigid support structure, a second set of apertures and a second group of mechanical fasteners reversibly vertically attaching and reversibly vertically aligning said second rigid multi-component support structure to a fourth said rigid multi-component support structure, C. A third set of apertures and a third group of mechanical fasteners reversibly attaching said rigid vertical components to said rigid horizontal components, and said third group of mechanical fasteners continuously adjusting a linear dimension solely within said third set of apertures, and D. A fourth set of apertures and a fourth group of mechanical fasteners, said fourth group of mechanical fasteners reversibly attaching said rigid vertical components to said rack base, and E. A fifth set of apertures and a fifth group of mechanical fasteners reversibly attaching mounted devices to said rigid vertical components, said fifth group of mechanical fasteners being the sole attachment of said mounted devices to said rigid vertical components, said rigid vertical components being reversibly interchangeable with each other, and said rigid horizontal components being reversibly interchangeable with each other, and wherein said rack base comprises two rack base legs, each said rack base leg being approximately thirty inches in anterior-posterior longitudinal length.

15. A mount rack frame comprising
A. a first rigid vertical component and a second rigid vertical component, said first rigid vertical component and said second rigid vertical component each being interchangeable with each other, and
B. an upper rigid horizontal component and a lower rigid horizontal component, said upper rigid horizontal component comprising a rigid strip with a width, longitudinal length, thickness and weight, said lower rigid horizontal component being quantitatively greater in weight than said upper rigid horizontal strip, said lower rigid horizontal component comprising aligned aperture pairs, said mount rack frame further comprising a first rack base leg and a second rack base leg, each said rack base leg being aligned with and attaching in a perpendicular manner to said first rigid vertical component or said second rigid vertical component, each said rack base leg being approximately twenty-two inches in longitudinal length, each said rack base leg comprising an anterior end, each said rigid vertical component attaching to a single corresponding said rack base leg at said anterior end of said corresponding rack base leg in a flush manner, said lower rigid horizontal component comprising a first horizontal component end and a second horizontal component end, said upper rigid horizontal component attaching to corresponding ends of said rigid vertical components, and said lower rigid horizontal component attaching to said rigid vertical components at said corresponding first horizontal component end and said second rigid horizontal component end, said mount rack frame being free-standing without attachment to or support from features exterior to said mount rack frame except for contact with a flat surface.

16. The mount rack frame of claim 15 wherein each said rigid vertical component comprises a width, a longitudinal length, a thickness and a weight, said longitudinal length of said rigid strip being quantitatively greater than said width and said thickness of said rigid strip, and said lower rigid horizontal component comprising a width, longitudinal length, thickness and weight, said lower rigid horizontal component comprising a horizontal component longitudinal recess, and said horizontal component longitudinal recess comprises said least four aligned aperture pairs.

17. The mount rack frame of claim 15 wherein said mount rack frame is free standing without additional supporting components of said mount rack frame, said mount rack frame attaching to devices, said devices being heat generating and asymmetrically attaching to said mount rack frame.

18. The mount rack frame of claim 15 wherein said rack base legs are removed, said mount rack frame further comprising a rigid modular rigid multi-component support structure, and said rigid modular multi-component support structure comprising rigid modular support structure rigid horizontal components, said rigid modular support structure rigid horizontal components comprising horizontal component aligned aperture pairs, said aligned aperture pairs within said lower rigid horizontal component congruently aligning with said horizontal component aligned aperture pairs, said modular rigid multi-component support structure attaching to a second rack base, said rigid modular multi-component support structure attaching to said mount rack frame with mechanical fasteners, said mechanical fasteners inserting within said congruently aligned apertures.

19. A mount rack frame comprising
a first rigid vertical component and a second rigid vertical component, said first rigid vertical component and said second rigid vertical component each being interchangeable with each other, each said rigid vertical component comprising a width, longitudinal length, thickness and weight, and an upper rigid horizontal component and a lower rigid horizontal component, said upper rigid horizontal component comprising a rigid strip with a width, longitudinal length, thickness and weight, said longitudinal length of said rigid strip being quantitatively greater than said width and said thickness of said rigid strip, each said lower rigid horizontal component comprising a width, longitudinal length, thickness and weight, said lower rigid horizontal component being quantitatively greater in weight than said upper rigid horizontal strip, said lower rigid horizontal component comprising a continuous horizontal component longitudinal recess, said lower rigid continuous horizontal component longitudinal recess comprising containing at least four aligned aperture pairs, said mount rack frame further comprising a first rack base leg and a second rack base leg, each said rack base leg being aligned with and attaching in a perpendicular manner to said first rigid vertical component or said second rigid vertical component, each said rack base leg being approximately twenty-two inches in longitudinal length, each said rack base leg comprising an anterior end, each said rigid vertical component attaching to a single corresponding said rack base leg at said anterior end of said corresponding rack base leg in a flush manner, said lower rigid horizontal component comprising a first horizontal component end and a second horizontal component end, said upper rigid horizontal component attaching to corresponding ends of said rigid vertical components, and said lower rigid horizontal component attaching to said rigid vertical component at said corresponding first horizontal component end and said second rigid horizontal component end, said mount rack frame being free-standing without attachment to or support from features exterior to said mount rack frame except for contact with a flat surface, and wherein said each said rigid vertical component weighs approximately 4 pounds and seven ounces, said lower rigid horizontal component weighs approximately three pounds eleven ounces, said upper rigid horizontal component weighs approximately 10.4 ounces and each said rack base leg weighs approximately three pounds and three ounces.

* * * * *